US012684813B2

(12) United States Patent (10) Patent No.: US 12,684,813 B2
Chiang et al. (45) Date of Patent: Jul. 14, 2026

(54) VERTICAL GATE-ALL-AROUND DEVICE

(71) Applicant: Taiwan Semiconductor Manufacturing Company, Ltd., Hsin-Chu (TW)

(72) Inventors: Kuo-Cheng Chiang, Hsinchu County (TW); Chih-Hao Wang, Hsinchu County (TW); Guan-Lin Chen, Hsinchu County (TW); Shi Ning Ju, Hsinchu City (TW); Jung-Chien Cheng, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 420 days.

(21) Appl. No.: 18/341,384

(22) Filed: Jun. 26, 2023

(65) Prior Publication Data

US 2024/0429318 A1 Dec. 26, 2024

(51) Int. Cl.
H10D 30/67 (2025.01)
H10D 30/01 (2025.01)
H10D 30/43 (2025.01)
H10D 62/10 (2025.01)
(Continued)

(52) U.S. Cl.
CPC ....... H10D 30/6728 (2025.01); H10D 30/014 (2025.01); H10D 30/031 (2025.01); H10D 30/43 (2025.01); H10D 30/6735 (2025.01); H10D 62/121 (2025.01); H10D 62/151 (2025.01); H10D 64/017 (2025.01); H10D 64/018 (2025.01)

(58) Field of Classification Search
CPC ............. H10D 30/6728; H10D 30/031; H10D 30/6735; H10D 84/016
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,796,666 B1 | 8/2014 | Huang et al. |

(Continued)

FOREIGN PATENT DOCUMENTS

| TW | 202232603 A | 8/2022 |
| TW | 202315136 A | 4/2023 |

*Primary Examiner* — Brian Turner
(74) *Attorney, Agent, or Firm* — HAYNES AND BOONE, LLP

(57) ABSTRACT

A vertically protruding structure is formed. The vertically protruding structure includes a substrate, a first semiconductor layer disposed over the substrate, a channel layer disposed over the first semiconductor layer, and a second semiconductor layer disposed over the channel layer. The first semiconductor layer and the second semiconductor layer each contain a first type of semiconductive material. The channel layer contains a second type of semiconductive material different from the first type. First recesses are formed in the first semiconductor layer and the second semiconductor layer. Each of the first recesses protrudes laterally inward. The first recesses are filled with dielectric spacers. The channel layer and the substrate are laterally trimmed. The remaining portions of the channel layer and the dielectric spacers define second recesses that protrude laterally inward. Gate structures are formed in the second recesses.

20 Claims, 36 Drawing Sheets

(51)  Int. Cl.
   *H10D 62/13*        (2025.01)
   *H10D 64/01*        (2025.01)

(56)                    References Cited

U.S. PATENT DOCUMENTS

| | | | |
|---|---|---|---|
| 8,815,712  B2 | 8/2014 | Wan et al. | |
| 8,816,444  B2 | 8/2014 | Wann et al. | |
| 8,823,065  B2 | 9/2014 | Wang et al. | |
| 8,860,148  B2 | 10/2014 | Hu et al. | |
| 8,963,258  B2 | 2/2015 | Yu et al. | |
| 9,093,530  B2 | 7/2015 | Huang et al. | |
| 9,105,490  B2 | 8/2015 | Wang et al. | |
| 9,171,929  B2 | 10/2015 | Lee et al. | |
| 9,214,555  B2 | 12/2015 | Oxland et al. | |
| 9,236,267  B2 | 1/2016 | De et al. | |
| 9,236,300  B2 | 1/2016 | Liaw | |
| 9,520,482  B1 | 12/2016 | Chang et al. | |
| 9,548,303  B2 | 1/2017 | Lee et al. | |
| 9,576,814  B2 | 2/2017 | Wu et al. | |
| 2013/0285116  A1 | 10/2013 | Lochtefeld et al. | |
| 2016/0380069  A1* | 12/2016 | Lee ................... | H01L 21/28255 |
| | | | 257/407 |
| 2017/0250288  A1* | 8/2017 | Colinge ................ | H10B 43/27 |
| 2017/0330958  A1* | 11/2017 | Coquand ............. | H10D 10/051 |
| 2017/0365673  A1* | 12/2017 | Cheng ................. | H10D 30/025 |
| 2018/0212041  A1* | 7/2018 | Dolny .............. | H01L 21/28061 |
| 2019/0081180  A1* | 3/2019 | Park ................... | H10D 30/6735 |
| 2020/0402994  A1* | 12/2020 | Yang ..................... | H10B 43/35 |
| 2021/0296319  A1* | 9/2021 | Sukekawa ............ | H10B 12/315 |

* cited by examiner

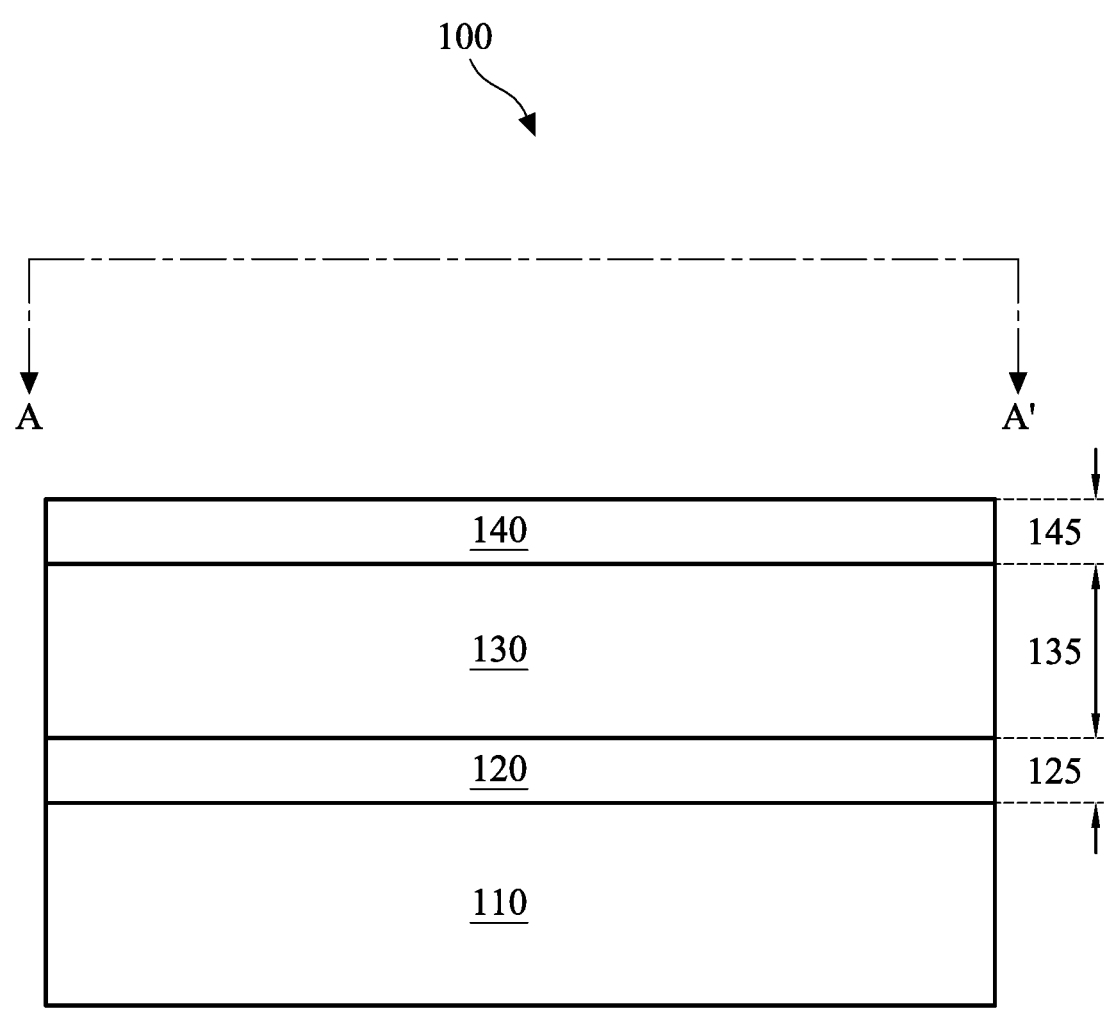
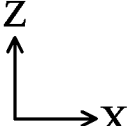
FIG. 1B

De-mesa Process

100

Y-Cut View

B                                                                    B'

1000

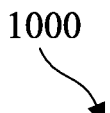

| Form a vertically protruding structure, the vertically protruding structure including a substrate, a first semiconductor layer disposed over the substrate, a channel layer disposed over the first semiconductor layer, and a second semiconductor layer disposed over the channel layer, wherein the first semiconductor layer and the second semiconductor layer each contain a first type of semiconductive material, and wherein the channel layer contains a second type of semiconductive material different from the first type | —1010 |

| Form first recesses in the first semiconductor layer and the second semiconductor layer, wherein each of the first recesses protrudes laterally inward | —1020 |

| Fill the first recesses with dielectric spacers | —1030 |

| Laterally trim the channel layer and the substrate, wherein remaining portions of the channel layer and the dielectric spacers define second recesses that protrude laterally inward | —1040 |

| Form gate structures in the second recesses | —1050 |

VERTICAL GATE-ALL-AROUND DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, as the scaling down process continues, certain challenges may arise. For example, the scaling down of IC devices may be constrained by factors such as a short channel effect, time-dependent dielectric breakdown, or parasitic resistance. Consequently, the performance and/or yield of existing IC devices have not been optimized. Therefore, although existing IC devices and their methods of fabrication have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 1A-25A illustrate a series of three-dimensional perspective views of an IC device at various stages of fabrication according to embodiments of the present disclosure.

FIGS. 1B-4B and 15B-17B illustrate a series of cross-sectional side views of an IC device at various stages of fabrication according to embodiments of the present disclosure.

FIG. 28 is a flowchart illustrating a method of fabricating an IC device according to embodiments of the present disclosure.

DETAILED DESCRIPTION

Figure 1A:
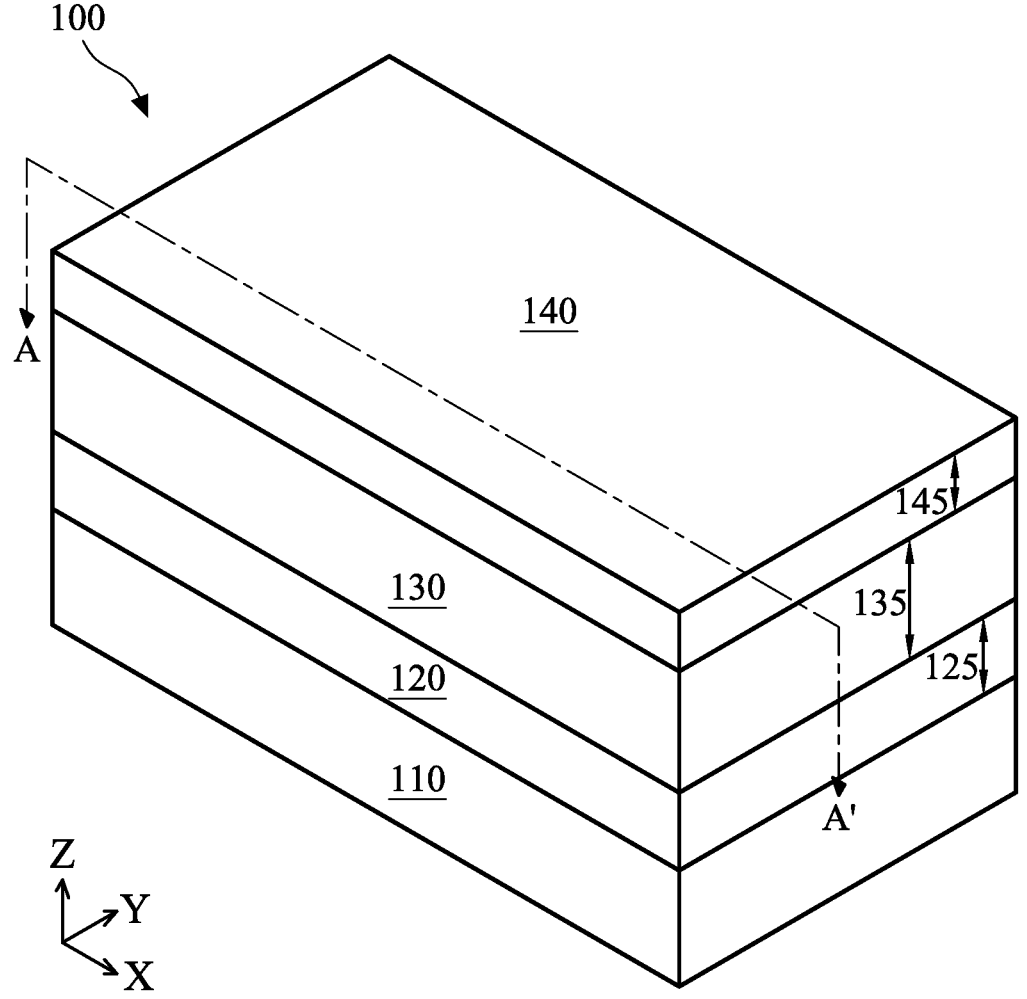

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to forming a vertical gate-all-around (GAA) device. In more detail, a GAA device is a multi-channel transistor device, where its multiple channels may be implemented as elongated nano-structure, such as nano-bars, nano-sheets, nano-tubes, or nano-wires, etc. Compared to planar transistors, or other types of three-dimensional transistors such as fin-line field effect transistors (FinFETs) that have semiconductor fin structures protruding vertically out of a substrate, GAA devices have various performance enhancements. As such, GAA devices have become increasingly popular in recent years.

However, GAA devices and/or the fabrication thereof may also encounter various challenges. For example, in a horizontal type of GAA device (hereinafter referred to as a horizontal GAA), the scaling down of IC component dimensions may be limited by factors such as short channel effect, gate-to-contact time-dependent dielectric breakdown (TDDB), and/or parasitic contact resistance. A vertical type of GAA device (hereinafter referred to as a vertical GAA) may improve some of these concerns associated with the horizontal GAA device. However, vertical GAA devices may suffer from unduly large variations in spacer thicknesses and/or gate lengths. This is because the spacer thicknesses and the gate lengths are defined by a combination of deposition and etch-back processes, which may be difficult to control with precision, especially as IC device sizes continue to shrink.

To address the issues discussed above, the present disclosure pertains to a vertical GAA device when the top spacer and bottom spacer thicknesses and the gate length are controlled by silicon/silicon germanium channel epi deposition and subsequent silicon germanium recess and spacer deposition processes. These processes can control the thicknesses of the top and bottom spacers and the gate length of the vertical GAA device herein with greater precision. In turn, the performance and/or yield of the vertical GAA device herein may be improved.

FIGS. 1A-25A illustrate a series of three-dimensional perspective views of an IC device 100 (as an example vertical GAA device herein) at various stages of fabrication according to embodiments of the present disclosure. To provide additional clarification, FIGS. 1B-4B and 15B-17B also illustrate a series of cross-sectional side views of the IC device 100 at stages of fabrication corresponding to FIGS. 1A-4A and 15A-17A, respectively. The cross-sectional side views of the FIGS. 1A-4A and 15A-17A are taken along a cutline A-A' that spans in an X-direction horizontally. As such, FIGS. 1A-4A and 15A-17A may also be referred to as X-cut views.

Referring now to FIGS. 1A and 1B, the IC device 100 includes a substrate 110. The substrate 110 may comprise an elementary (single element) semiconductor, such as silicon (Si) in the illustrated embodiment. In other embodiments, the substrate 110 may include other semiconductor materials, such as germanium, and/or compound semiconductors, such as silicon carbide, gallium arsenic, gallium phosphide, indium phosphide, indium arsenide, indium antimonide, and/or other suitable materials. In further embodiments, the substrate 110 may include an alloy semiconductor, such as SiGe, GaAsP. AlInAs, AlGaAs, GaInAs, GaInP, GaInAsP, and/or other suitable materials. In the illustrated embodiment, the substrate 110 comprises a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may further include a conductive layer, a semiconductor layer, a dielectric layer, other layers, or combinations thereof.

A semiconductor layer 120 is formed over the substrate 110. In some embodiments, the semiconductor layer 120 has a different material composition than the substrate 110. For example, in embodiments where the substrate 110 has a silicon material composition, the semiconductor layer 120 has a silicon germanium (SiGe) material composition. In some embodiments, the semiconductor layer 120 is formed via a deposition process, such as an atomic layer deposition (ALD) process, a chemical vapor deposition (CVD) process, a physical vapor deposition (PVD) process, or combinations thereof. The deposition process parameters may be tuned to ensure that a thickness 125 (measured in the vertical Z-direction) of the semiconductor layer 120 can achieve a specific value range. In some embodiments, the thickness 125 is in a range between about 3 nanometers (nm) and about 15 nm. As will be discussed in more detail below, the value of the thickness 125 is specifically configured herein to define a thickness of a bottom spacer that is to be formed later.

A channel layer 130 is formed over the semiconductor layer 120. In some embodiments, the channel layer 130 has a different material composition than the semiconductor layer 120, but it may have a same material composition as the substrate 110. For example, in embodiments where the substrate 110 has a Si material composition, and the semiconductor layer 120 has a SiGe material composition, the channel layer 130 has a Si material composition. In some embodiments, the channel layer 130 is formed via a deposition process, such as ALD, CVD, PVD, or combinations thereof. The deposition process parameters may be tuned to ensure that a thickness 135 (measured in the vertical Z-direction) of the channel layer 130 can achieve a specific value range. In some embodiments, the thickness 135 is in a range between about 5 nm and about 15 nm. The value of the thickness 135 is configured to be large enough to provide a sufficient separation between the semiconductor layers 120 and 140, so that a metal-containing gate structure can be formed therebetween in a later fabrication step. Meanwhile, the value of the thickness 135 is also configured to be small enough to not unduly increase the size of the IC device 100.

A semiconductor layer 140 is formed over the channel layer 130. In some embodiments, the semiconductor layer 140 has a different material composition than the channel layer 130 but may have a same material composition as the semiconductor layer 120. For example, in embodiments where the channel layer 130 has a Si material composition, and the semiconductor layer 120 has a SiGe material composition, the semiconductor layer 140 has a SiGe material composition as well. In some embodiments, the semiconductor layer 140 is formed via a deposition process, such as ALD, CVD, PVD, or combinations thereof. The deposition process parameters may be tuned to ensure that a thickness 145 (measured in the vertical Z-direction) of the semiconductor layer 140 can achieve a specific value range. In some embodiments, the thickness 145 is in a range between about 3 nm and about 15 nm. As will be discussed in more detail below, the value of the thickness 145 is specifically configured herein to define a thickness of a top spacer that to be formed later.

Figure 2A:
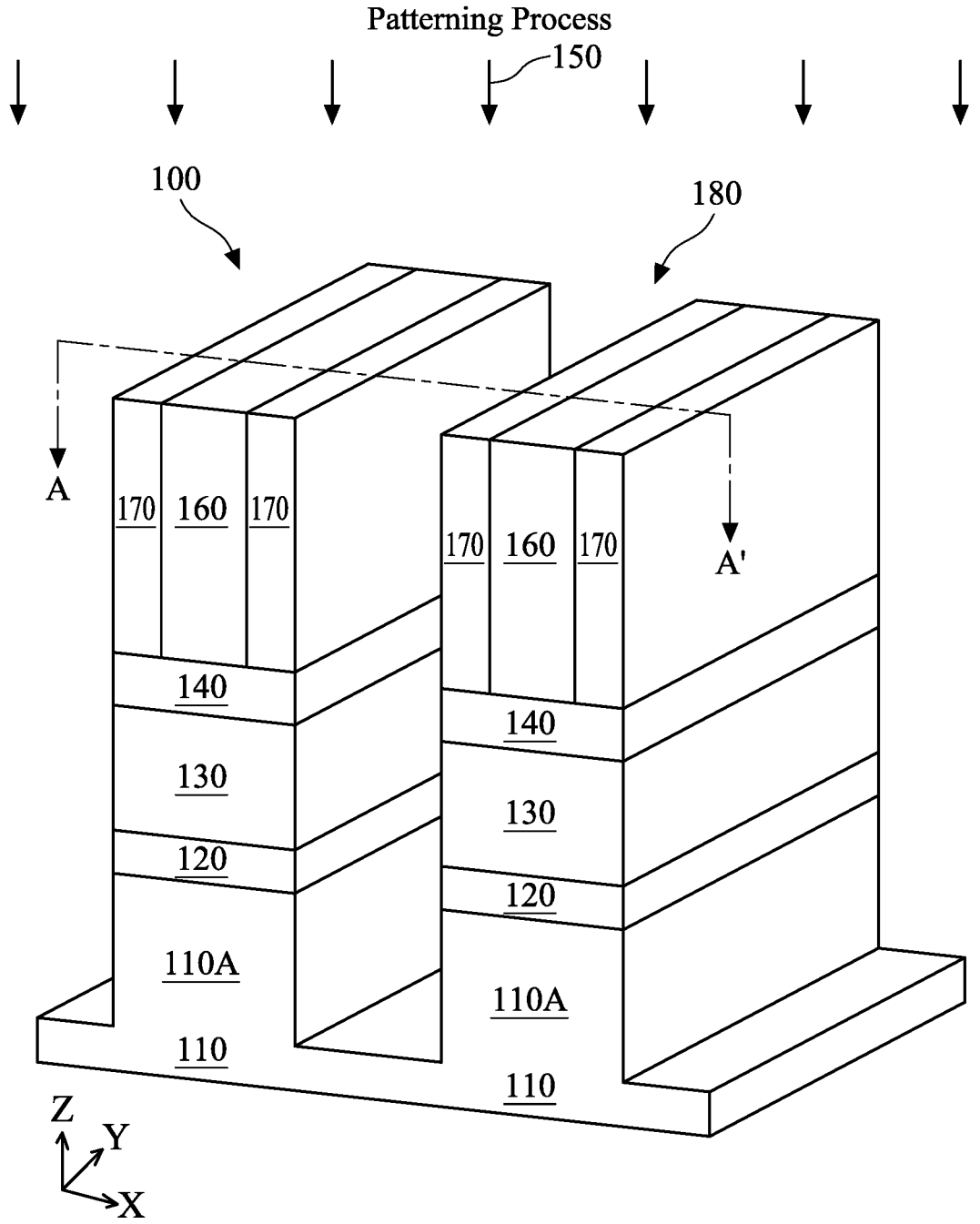
Figure 2B:
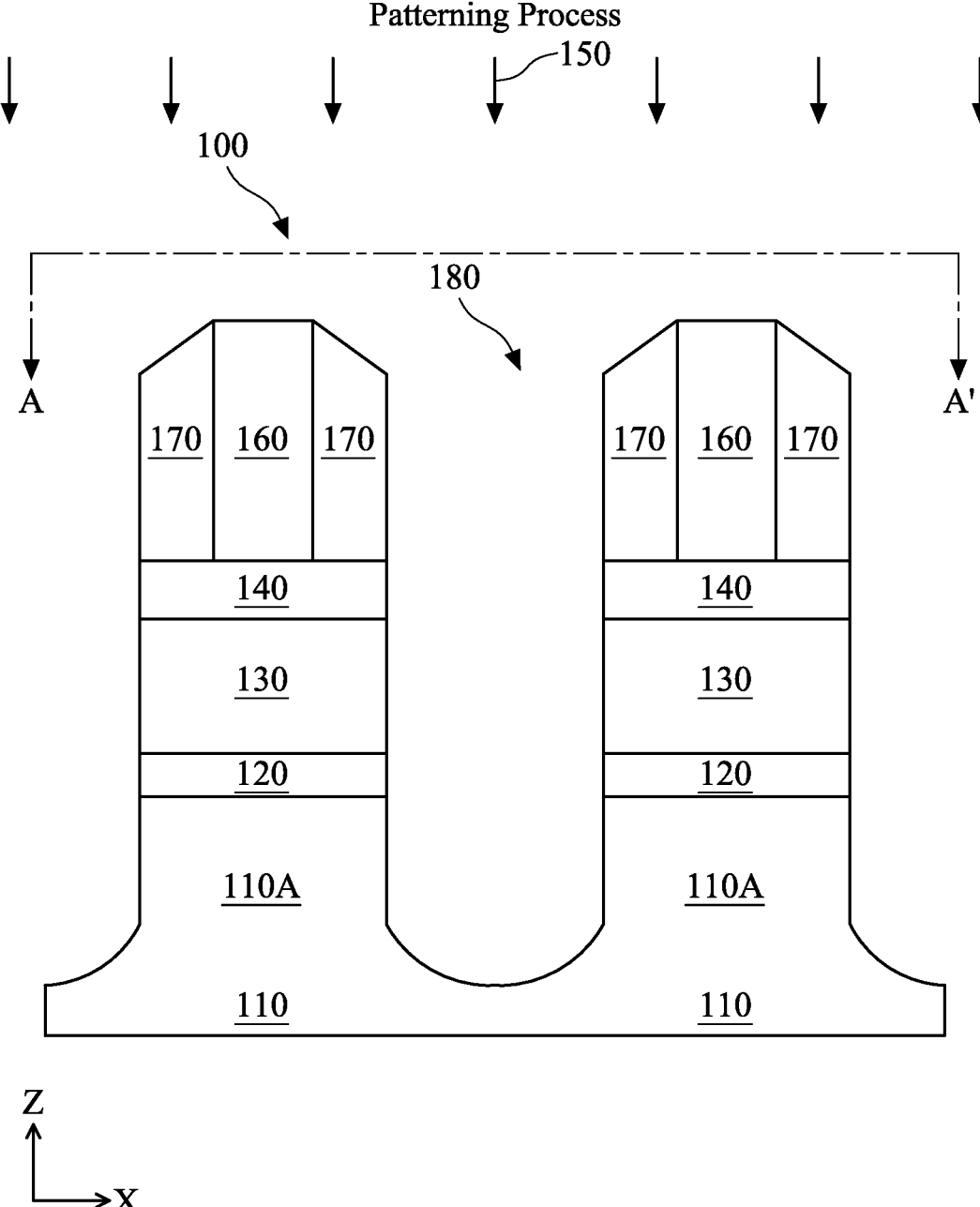

Referring now to FIGS. 2A and 2B, a patterning process 150 is performed to the IC device 100 to pattern the IC device into a plurality of vertically protruding structures. As a part of the patterning process 150, a plurality of hard masks 160 and spacers 170 are formed over the semiconductor layer 140. The spacers 170 are formed on the sidewalls of the hard masks 160. The hard masks 160 and the spacers 170 may include dielectric materials, such as silicon oxide, silicon nitride, silicon oxynitride, silicon carbide, etc. It is understood, however, that the material compositions of the hard masks 160 and the spacers 170 may be different from one another.

Using the hard masks 160 and the spacers 170 as protective etching masks, one or more etching processes may be performed to etch the semiconductor layer 140, the channel layer 130, the semiconductor layer 120, and portions of the substrate 110. Portions of the semiconductor layer 140, the channel layer 130, the semiconductor layer 120, and the substrate 110 not protected by the hard masks 160 and the spacers 170 are etched away. The remaining portions form vertically protruding structures that are separated by an opening 180. The opening 180 extends vertically downwards in the Z-direction and horizontally in the Y-direction. Note that portions of the substrate 110 that are separated by the opening 180 may be considered active regions 110A. In other words, the active regions 110A are portions of the substrate 110 that protrude vertically out of the substrate 110 in the Z-direction.

Figure 3A:
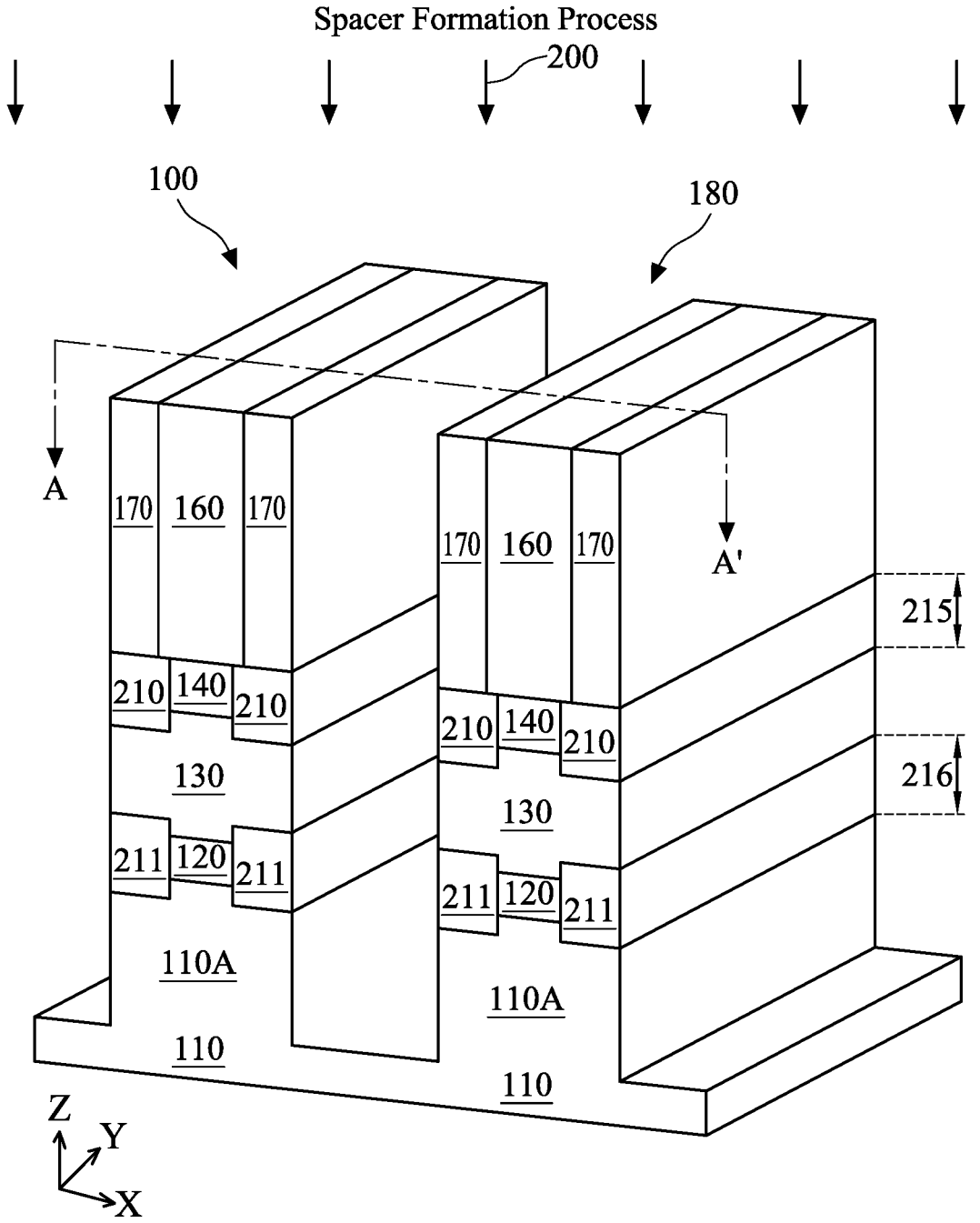
Figure 3B:
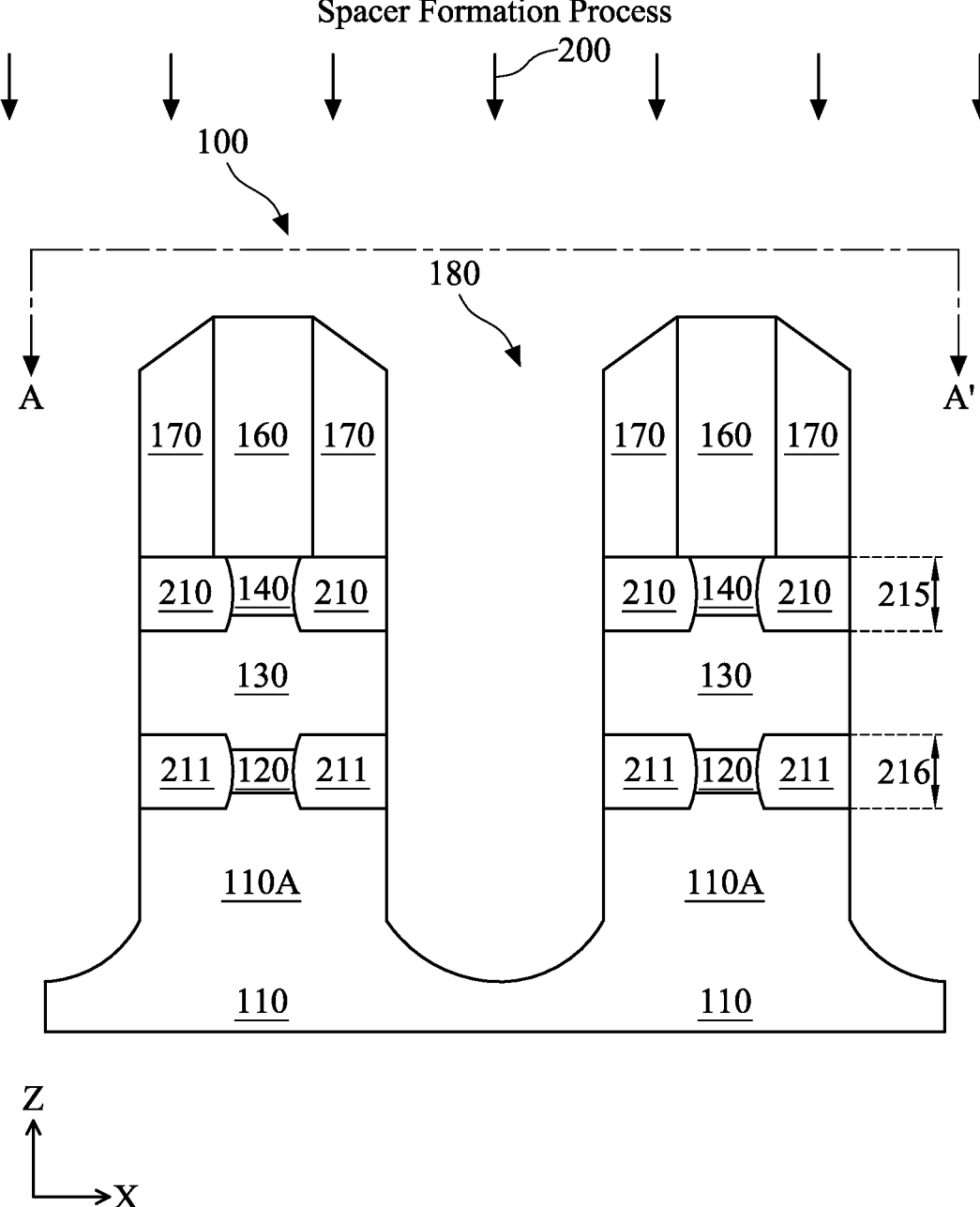

Referring now to FIGS. 3A and 3B, a spacer formation process 200 is performed to the IC device 100 to form a plurality of top spacers 210 and a plurality of bottom spacers 211. In more detail, the spacer formation process 200 includes one or more etching processes, such as wet etching or dry etching processes. The etching processes are configured with sufficient etching selectivity to partially etch away the semiconductor layers 140 and 120 laterally (e.g., in the X-direction) without substantially affecting the spacers 170 or the hard masks 160, so that lateral recesses may be formed in the semiconductor layers 140 and 120. Portions of the semiconductor layers 140 and 120 still remain after the etching processes.

Note that since the material compositions between the channel layer 130 and the semiconductor layers 140 and 120 are similar (e.g., Si versus SiGe), the etching selectivity may be lower between them. As such, the etching processes may partially remove portions of the channel layer 130 that are near the semiconductor layers 140 and 120 as well. In other words, the lateral recesses formed in the semiconductor layers 140 and 120 may have slightly greater vertical dimensions in the Z-direction than the semiconductor layers 140 and 120 themselves. Alternatively, the relatively low etching selectivity between the channel layer 130 and the semiconductor layers 140 and 120 may lead to an incomplete removal of the semiconductor layers 140 and 120, such that the lateral recesses formed in the semiconductor layers 140 and 120 may actually have shorter vertical dimensions in the Z-direction than the semiconductor layers 140 and 120.

Regardless of how the lateral recesses are etched, the spacer formation process 200 also includes one or more deposition processes to deposit a dielectric material (e.g., SiN, SiCN, SiOC, or SiOCN) to fill the lateral recesses in the semiconductor layers 120 and 140. As a result, the top spacers 210 are formed by the dielectric materials filling the lateral recesses in the semiconductor layer 140, and the bottom spacers 211 are formed by the dielectric materials filling the lateral recesses in the semiconductor layer 120. The top spacers 210 are also disposed above the channel layer 130, and the bottom spacers 211 are also disposed below the channel layer 130.

As shown in FIGS. 3A and 3B, the top spacers 210 are each formed to have a thickness 215 measured in the vertical Z-direction, and the bottom spacers 211 are each formed to have a thickness 216 measured in the vertical Z-direction. According to the various aspects of the present disclosure, the thickness 215 is correlated with (or partially set by) the thickness 145 (see FIGS. 1A-1B) of the semiconductor layer 140, and the thickness 216 is correlated with (or partially set by) the thickness 125 (see FIGS. 1A-1B) of the semiconductor layer 120. This is because the thicknesses 215 and 216 (of the top spacers 210 and the bottom spacers 211) directly corresponds to the vertical dimensions of the lateral recesses etched into the semiconductor layers 140 and 120. As such, the greater the thicknesses 145 and 125 are configured for the semiconductor layers 140 and 120 initially, the greater the vertical dimensions of the lateral recesses etched into the semiconductor layers 140 and 120, and the greater the thicknesses 215 and 216 of the top spacers 210 and the bottom spacers 211, respectively. Conversely, the smaller the thicknesses 145 and 125 are configured for the semiconductor layers 140 and 120 initially, the smaller the vertical dimensions of the lateral recesses etched into the semiconductor layers 140 and 120, and the smaller the thicknesses 215 and 216 of the top spacers 210 and the bottom spacers 211, respectively. The fact that the thicknesses 215 and 216 are indirectly set by the thicknesses 145 and 125 of the semiconductor layers 140 and 120 is one of the distinct aspects of the present disclosure, which is also an inherent result of the unique fabrication process flow herein. Compared to other implementations of vertical GAA devices, the top spacers 210 and the bottom spacers 211 can achieve thicknesses 215 and 216 with a greater degree of precision, which can improve device performance, including but not limited to uniformity among multiple devices.

Note that although the thicknesses 215 and 216 are indirectly determined by the thicknesses 145 and 125 of the semiconductor layers 140 and 120, they may not be identical to one another. For example, since the lateral etching processes may partially remove portions of the channel layer 130, the resulting lateral recesses may be slightly longer in the vertical Z-direction than the thicknesses 145 and 125 (as in the illustrated embodiment). As such, the thicknesses 215 and 216 may be slightly greater than the thicknesses 145 and 125 in some embodiments. Alternatively, the lateral etching processes may not fully remove portions of the semiconductor layers 140 and 120, which means that the resulting lateral recesses may be slightly shorter in the vertical Z-direction than the thicknesses 145 and 125. In some embodiments, a difference between the thickness 215 and the thickness 145 may be in a range between about +0.5 nanometers and about-0.5 nanometers, a ratio between the thickness 215 and the thickness 145 may be in a range between about 1 and about 2, a difference between the thickness 216 and the thickness 125 may be in a range between about +0.5 nanometers and about-0.5 nanometers, and a ratio between the thickness 216 and the thickness 125 may be in a range between about 1 and about 2.

Regardless of the specific values of these ratio ranges above, the fact is that they are still close to 1:1, which means that the thicknesses 215 of the top spacers 210 and the thicknesses 216 of the bottom spacers 211 are still mostly set by the thicknesses 145 and 125 of the semiconductor layers 140 and 120. Since the values of the thicknesses 145 and 125 of the semiconductor layers 140 and 120 can be finely controlled, the values of the thicknesses 216 and 215 of the top spacers 210 and the bottom spacers 211 can be fined controlled as well.

Figure 4A:
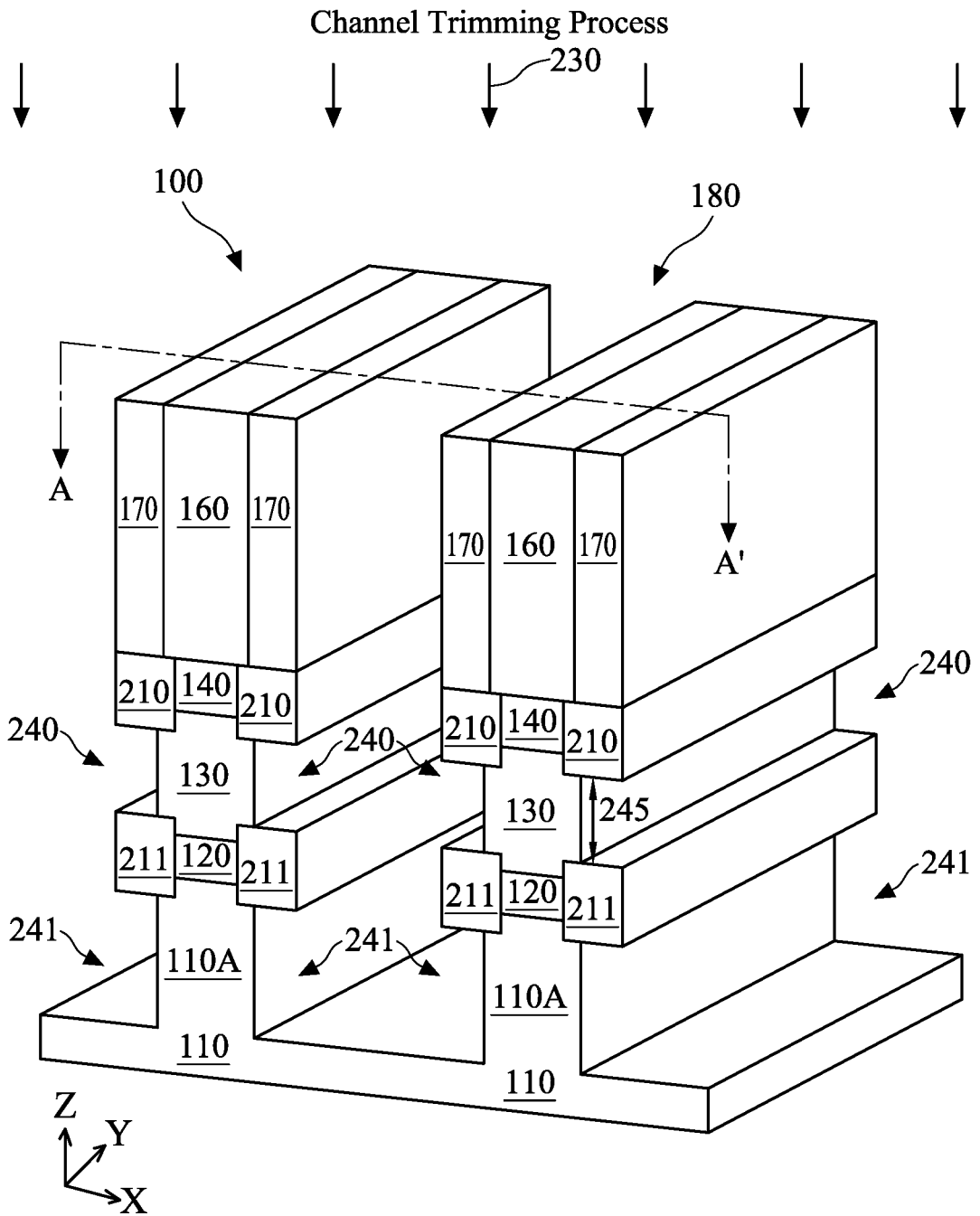
Figure 4B:
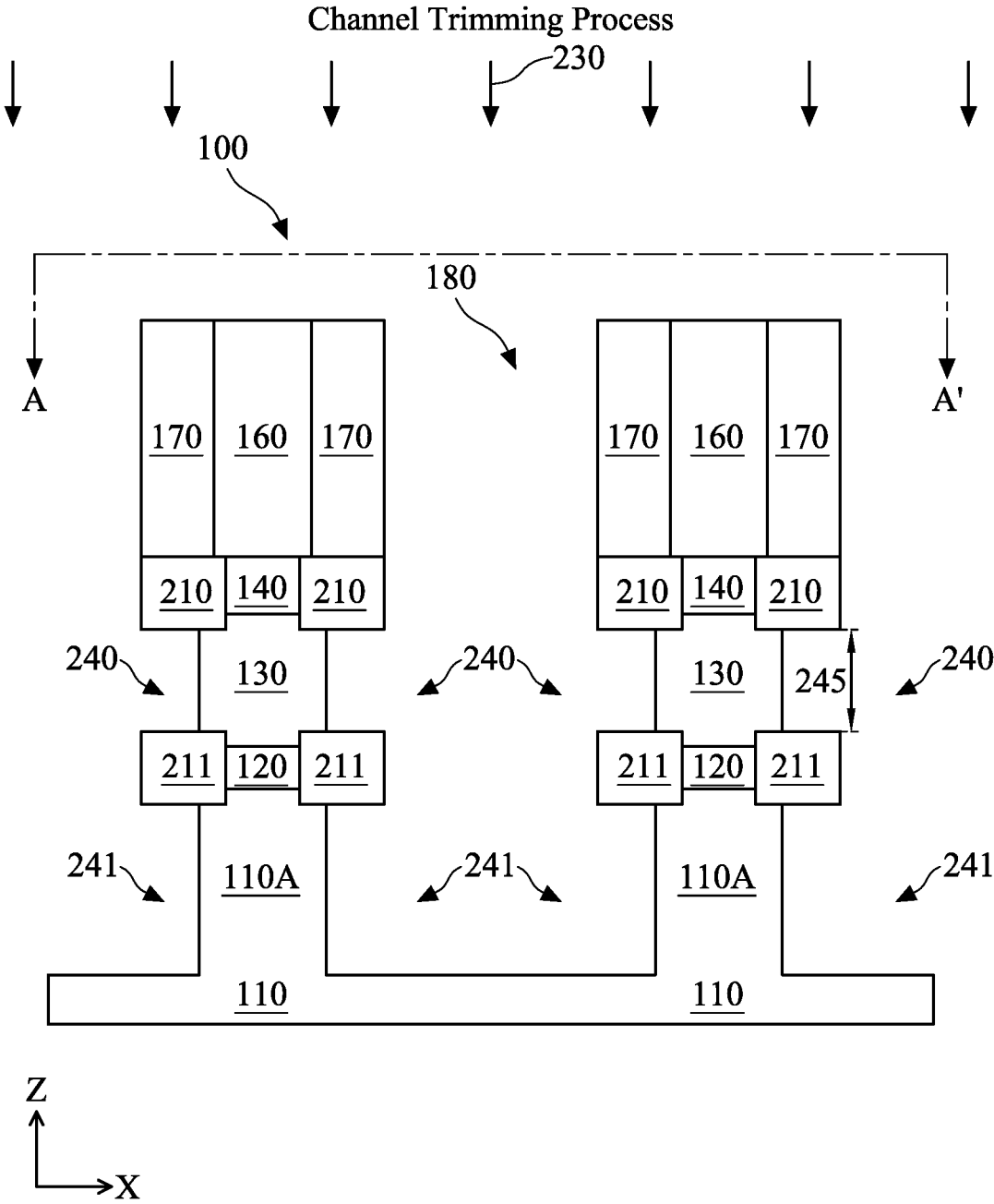

Referring now to FIGS. 4A and 4B, a channel trimming process 230 is performed to the IC device 100 to form a plurality of recesses 240. In more detail, the channel trimming process 230 includes one or more etching processes that partially removes the channel layer 130 and the active regions 110A. The etching processes are configured with a sufficient etching selectivity between the channel layer 130 and the active regions 110A, and the spacers 170, the top spacers 210, and the bottom spacers 211. In other words, the channel layer 130 and the active regions 110A are etched away at a substantially faster etching rate, while the spacers 170, the top spacers 210, and the bottom spacers 211 are etched away at a substantially slower etching rate. As a result, the plurality of recesses 240 are formed, where the walls of the channel layers 130 define side surfaces of each of the recesses 240, and the bottom surfaces of the top spacers 210 and the top surfaces of the bottom spacers 211 define the top and bottom surfaces of each of the recesses 240. Note that the etching processes also form recesses 241, which are located below the recesses 240. Each of the recesses 240 and 241 extend laterally toward the channel layer 130 (or toward the active region 110A) in the X-direction. The recesses 240 and 241 are also elongated in the Y-direction.

As shown in FIGS. 4A and 4B, the recesses 240 each have a vertical dimension 245 measured in the Z-direction. The vertical dimension 245 is correlated with a thickness 135 (see FIGS. 1A and 1B) of the channel layer 130. In other words, the greater the thickness 135, the greater the vertical dimension 245, and vice versa. In some embodiments, a ratio between the vertical dimension 245 and the thickness 135 may be in a range between about 0.6 and about 1. As will be discussed in more detail below, a metal-containing gate structure will be formed in each of the recesses 240. Therefore, it can be said that the present disclosure defines the dimensions of the gate structure (e.g., a gate height) by carefully configuring the thickness 135 of the channel layer 130 in a prior deposition process performed in FIGS. 1A and 1B. This is another unique aspect of the fabrication process flow according to the present disclosure.

Figure 5A:
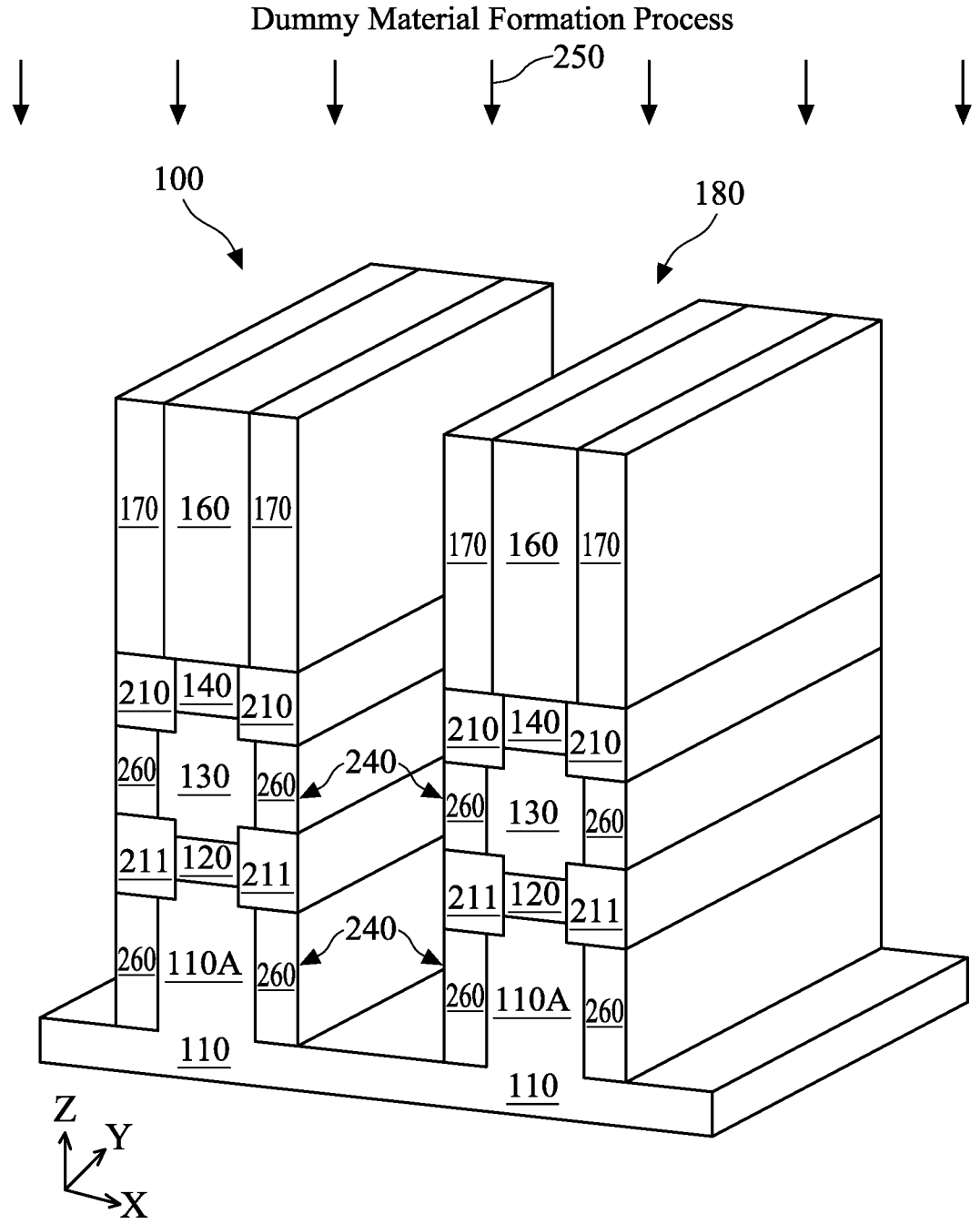

Referring now to FIG. 5A, a dummy material formation process 250 is performed to the IC device 100 to form dummy materials 260 to fill the recesses 240 and the recesses 241. For example, one or more deposition processes may be performed to deposit the dummy materials 260. The dummy materials 260 may be an easily removable material and/or configured to have an etching selectivity with the other components of the IC device 100. In some embodiments, the dummy material 260 may be a dielectric material, such as a nitride material. In other embodiments, the dummy material 260 may be a semiconductive material, such as a SiGe material.

Figure 6A:
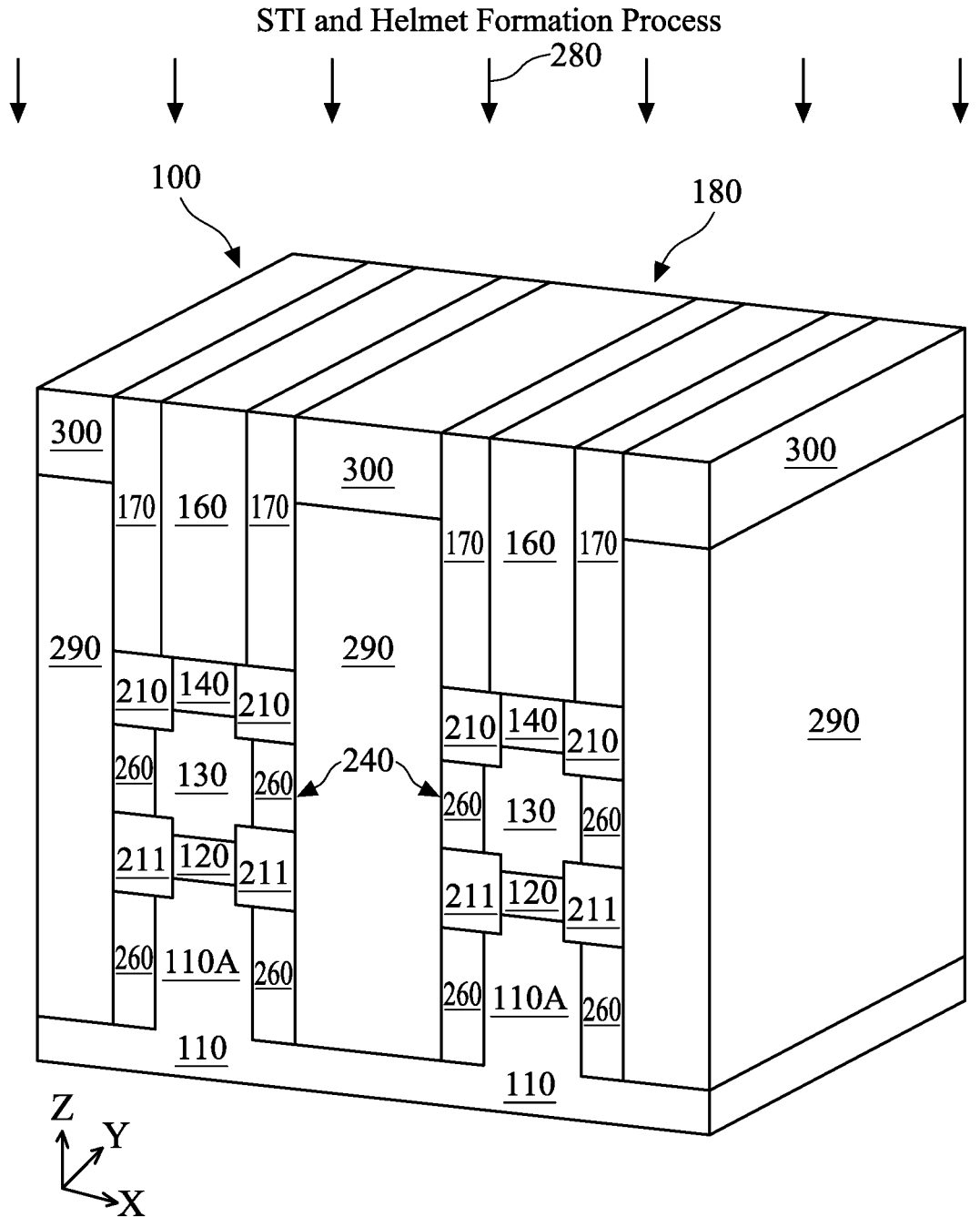

Referring now to FIG. 6A, an STI and helmet formation process 280 may be performed to form STI structures 290 and helmet structures 300. The STI structures 290 may be formed by depositing a dielectric material, such as silicon oxide, to fill the opening 180. The dielectric material is also deposited on the sidewalls of the spacers 170, the top spacers 210, the dummy materials 260, and the bottom spacers 211. The helmet structures 300 may be formed by partially etching the STI structures 290 to form recesses, and subsequently filling these recesses with another type of dielectric material that is more etching resistant than the STI structures 290. In some embodiments, the helmet structures 300 may include silicon nitride. It is understood that the STI and helmet formation process 280 may also include a planarization process (e.g., a CMP process) to planarize the upper surfaces of the helmet structures 300, the spacers 170, and the hard masks 160.

Figure 7A:
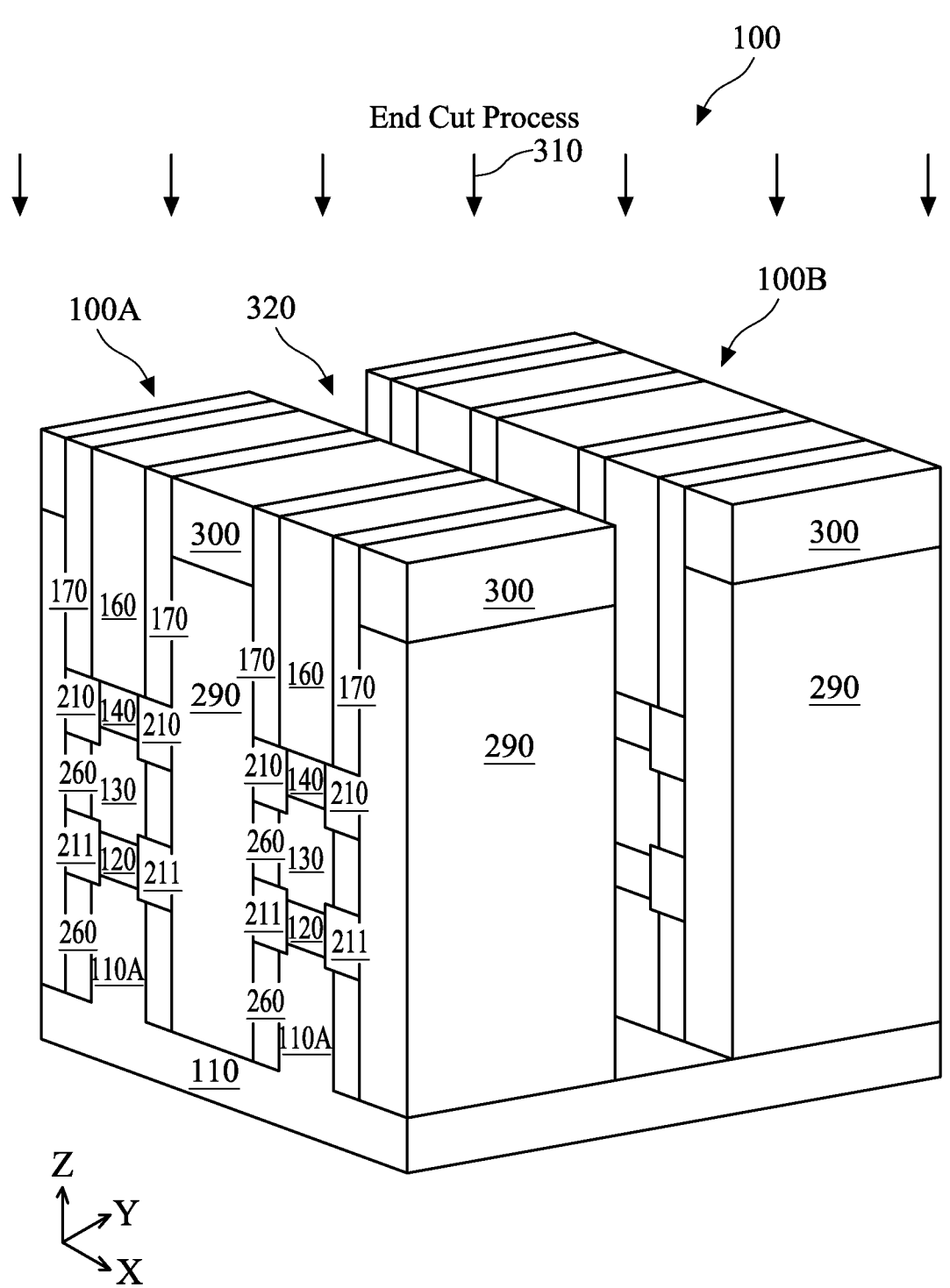

Referring now to FIG. 7A, an end cut process 310 is performed to the IC device 100 to form an opening 320. For example, the end cut process 310 may include one or more patterning and etching processes to selectively remove materials from the various components of the IC device 100 until the substrate 110 is reached. The resulting opening 320 extends vertically downwards in the Z-direction and horizontally in the X-direction. The opening 320 separates the IC device 100 into two vertical stacks 100A and 100B.

Figure 8A:
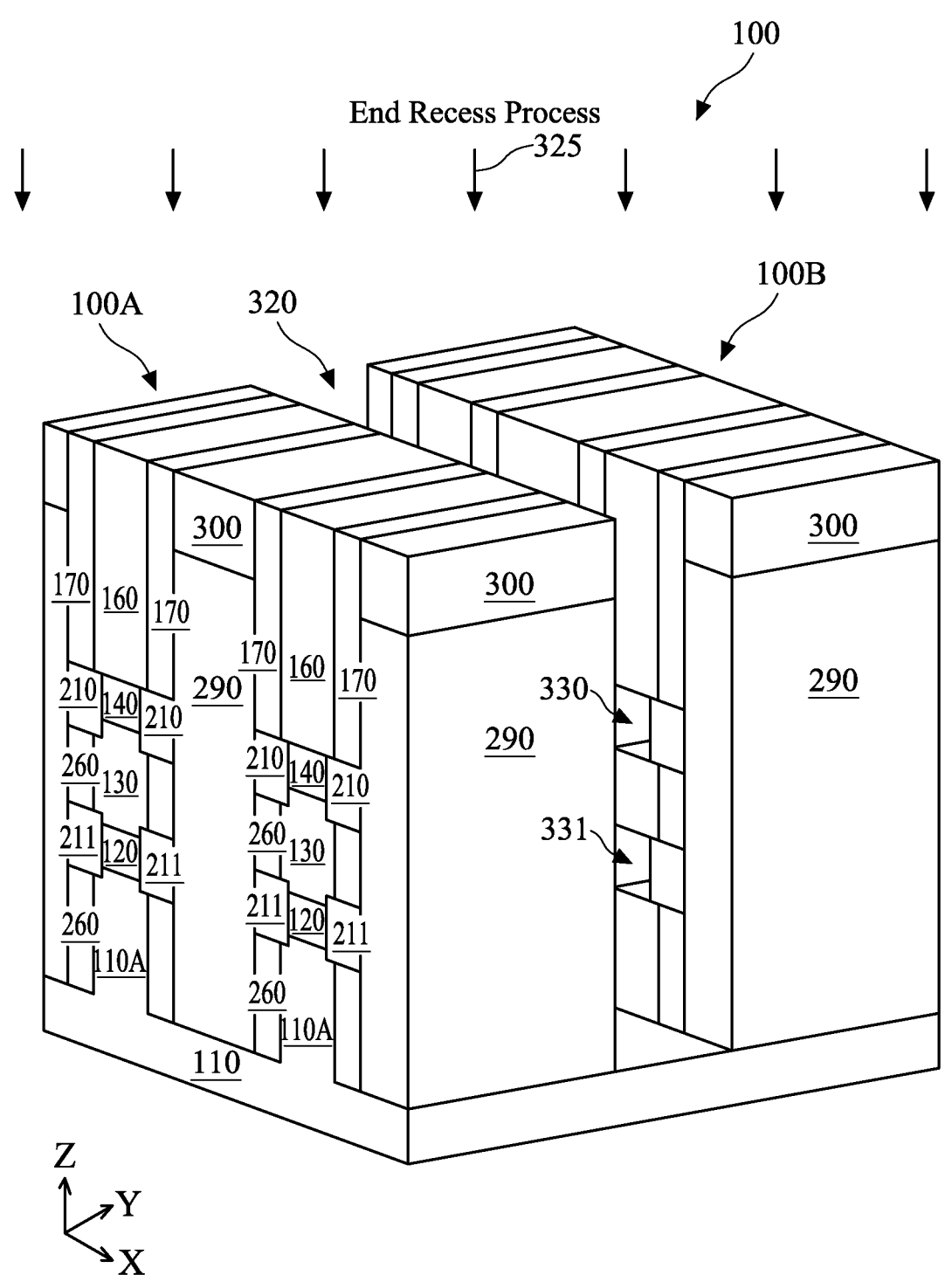

Referring now to FIG. 8A, an end recess process 325 is performed to the IC device 100 to form a plurality of lateral recesses 330 and 331. In more detail, the end recess process 325 may include one or more etching processes to selectively remove portions of the semiconductor layers 140 and 120. The etching processes are configured to have a sufficient etching selectivity between the materials of the semiconductor layers 140 and 120 and the other components of the IC device 100. For example, the materials (e.g., SiGe) of the semiconductor layers 140 and 120 are etched away at a substantially faster rate than the active regions 110A, the channel layer 130, the top spacers 210, the bottom spacers 211, the hard masks 160, the spacers 170, and the STI structures 290. As a result, the lateral recesses 330 are formed in place of the partially removed semiconductor layers 140, and the lateral recesses 331 are formed in place of the partially removed semiconductor layers 120.

Note that the lateral recesses 330 and 331 extend horizontally from the opening 320 into both the vertical stacks 100A and 100B in the Y-direction. The three-dimensional perspective view of FIG. 8A is displayed in a manner such that the lateral recesses 330 and 331 in the vertical stack 100B are clearly shown, but the corresponding lateral recesses 330 and 331 in the vertical stack 100A are not directly visible in FIG. 8A.

Figure 9A:
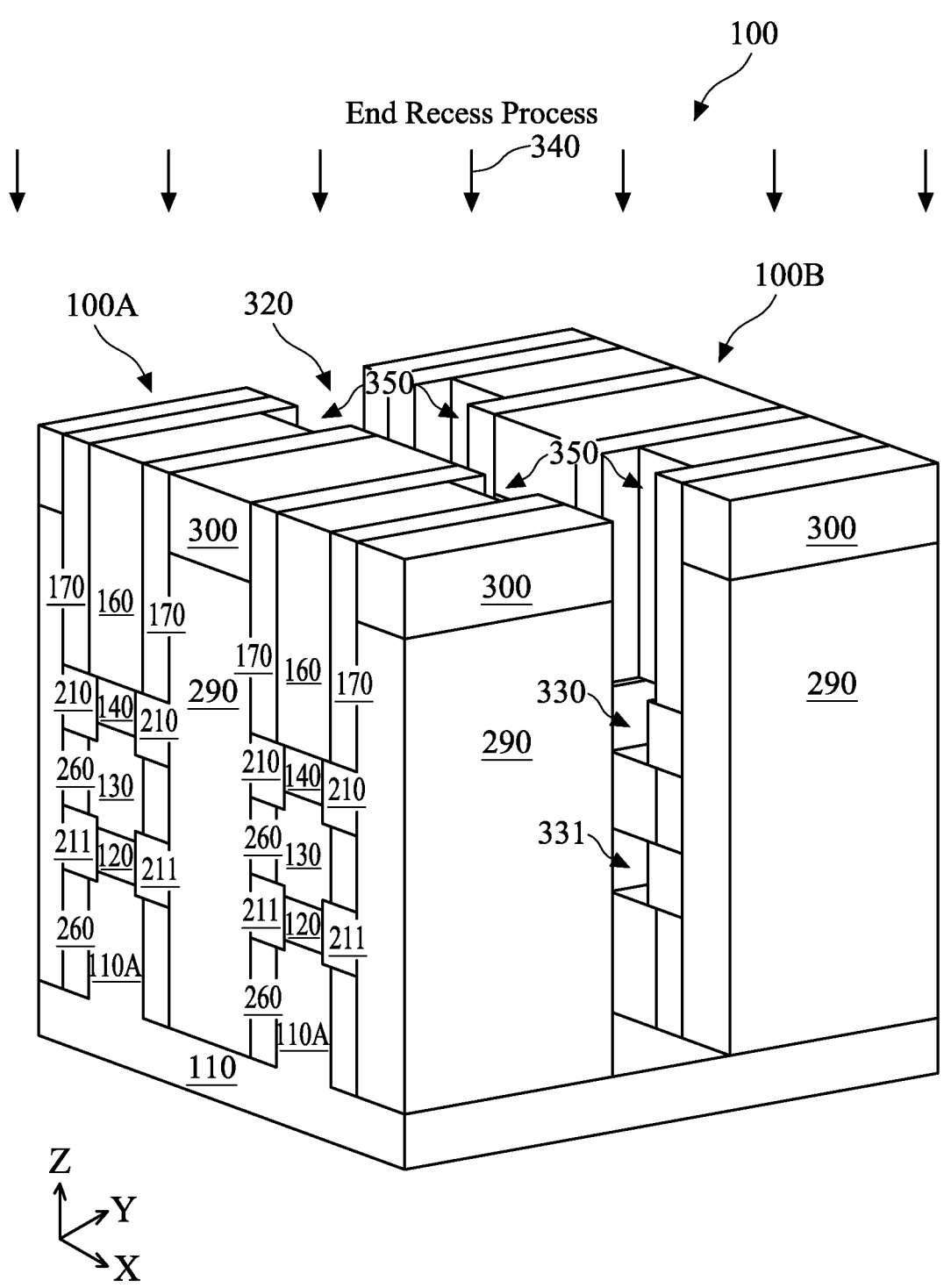

Referring now to FIG. 9A, an end recess process 340 is performed to the IC device 100 to form a plurality of lateral recesses 350. In more detail, the end recess process 340 may include one or more etching processes to selectively remove portions of the hard masks 160. The etching processes are configured to have a sufficient etching selectivity between the materials of the hard masks 160 and the other components of the IC device 100. For example, the materials of the hard masks 160 are etched away at a substantially faster rate than the rest of the components of the IC device 100. As a result, the lateral recesses 350 are formed in place of the partially removed hard masks 160. The lateral recesses 350 each extend vertically in the Z-direction and horizontally in the Y-direction. The lateral recesses 350 are also connected with the lateral recesses 330 formed previously.

Figure 10A:
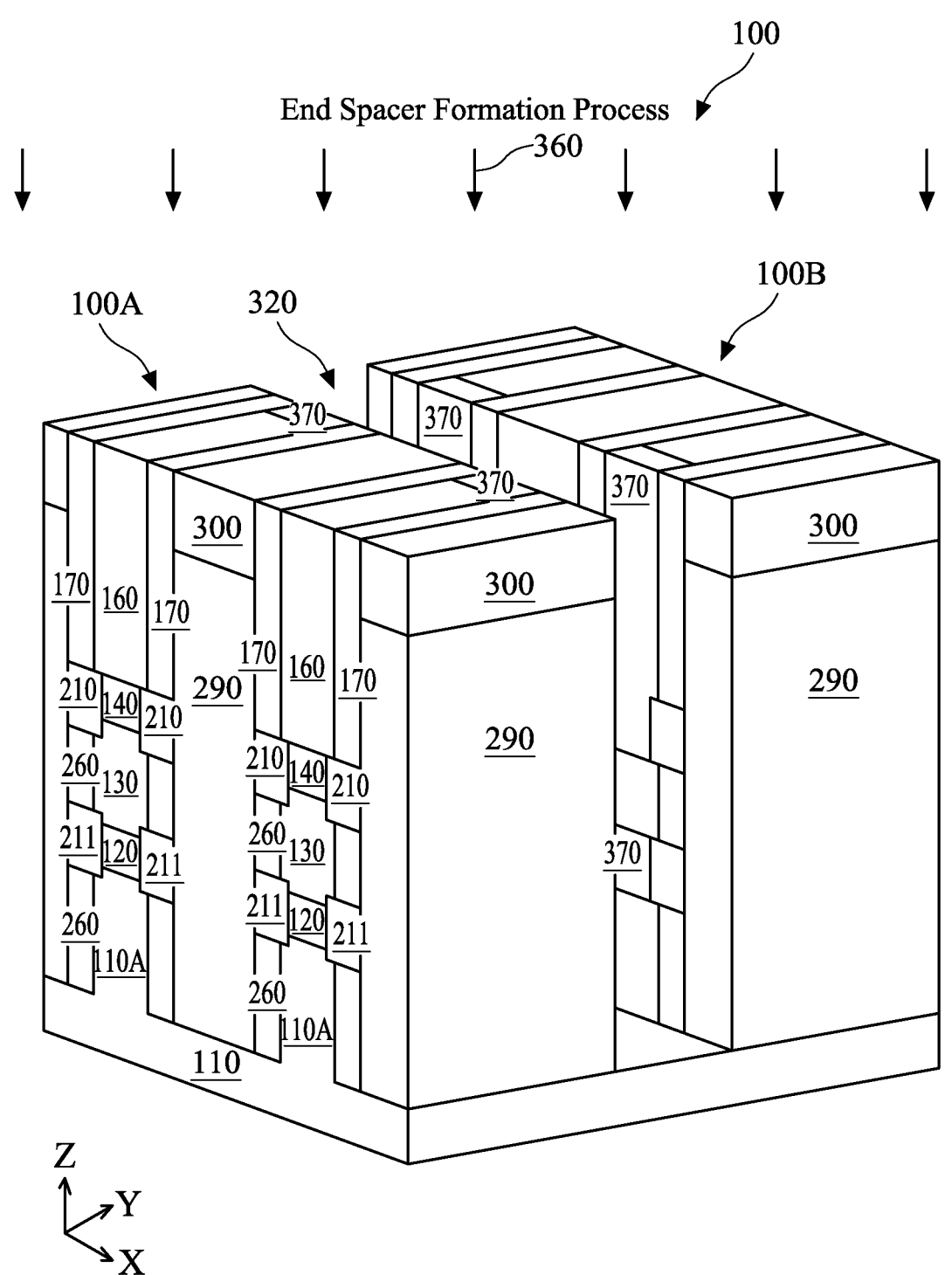

Referring now to FIG. 10A, an end spacer formation process 360 is performed to the IC device 100 to form end spacers 370 in the lateral recesses 330-331 and 350. For example, the end spacer formation process 360 includes one or more deposition processes, in which a dielectric material (e.g., silicon oxide, silicon nitride, silicon oxynitride, etc.) is deposited into the lateral recesses 330-331 and 350, thereby forming the end spacers 370.

Figure 11A:
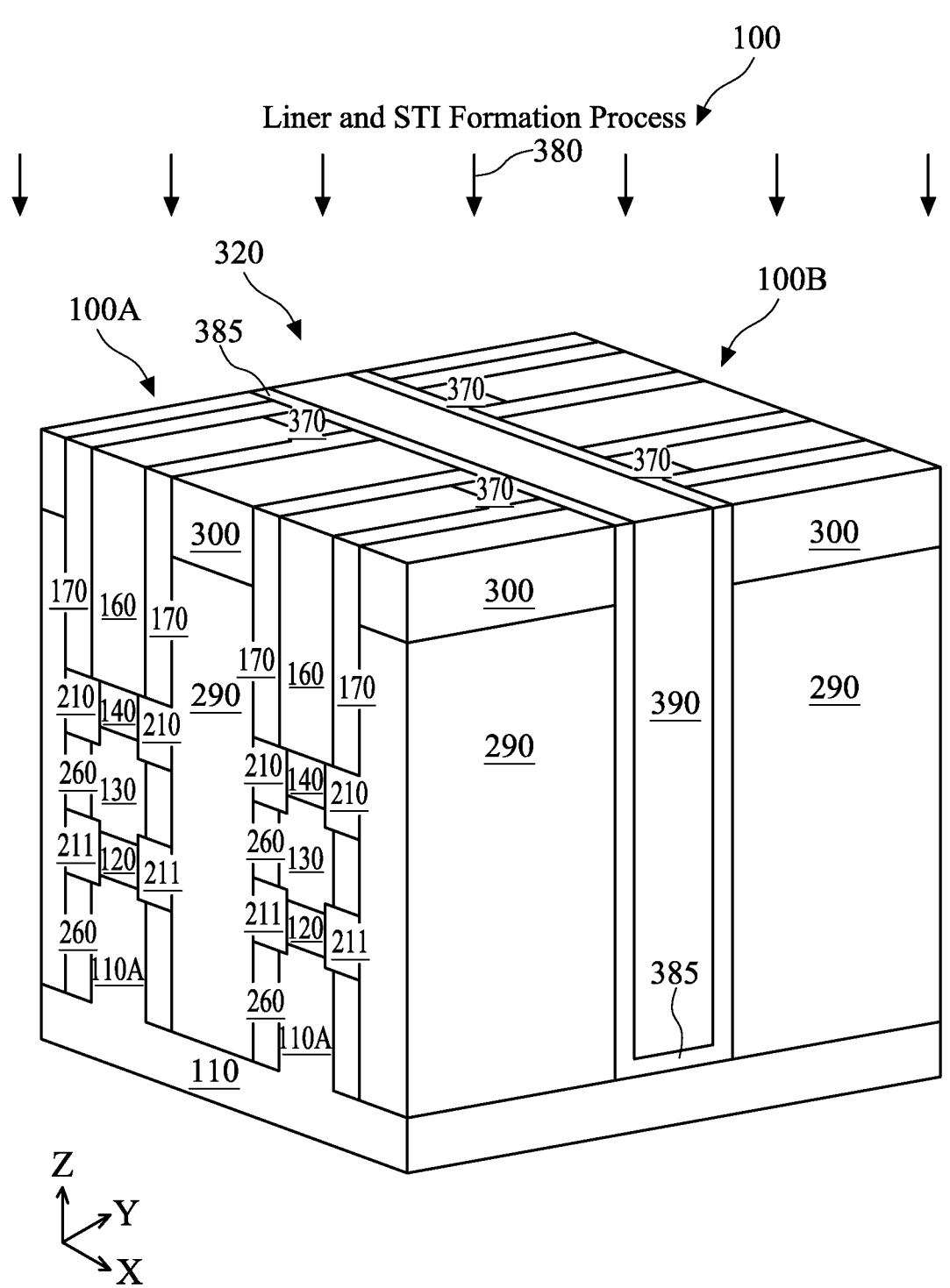

Referring now to FIG. 11A, a liner and STI formation process 380 is performed to the IC device 100 to form a liner 385 and another STI structure 390. In more detail, a deposition process may be performed as a part of the liner and STI formation process 380 to deposit a liner in the opening 320. The liner 385 is formed on the upper surface of the substrate 110 and on the side surfaces of the STI structure 290, the helmet structure 300, and the end spacers 370. In some embodiments, the liner 385 includes a nitride material, such as silicon nitride. Thereafter, another deposition process may be performed as a part of the liner and STI formation process 380 to deposit a dielectric material in the opening 320. The deposited material fills the opening 320 completely. In some embodiments, the STI structure 390 may have a same material composition (e.g., silicon oxide) as the STI structure 290. It is understood that a planarization process, such as a CMP process, may be performed to planarize the upper surfaces of the liner 385 and the STI structure 390 with the rest of the components of the IC device 100.

Figure 12A:
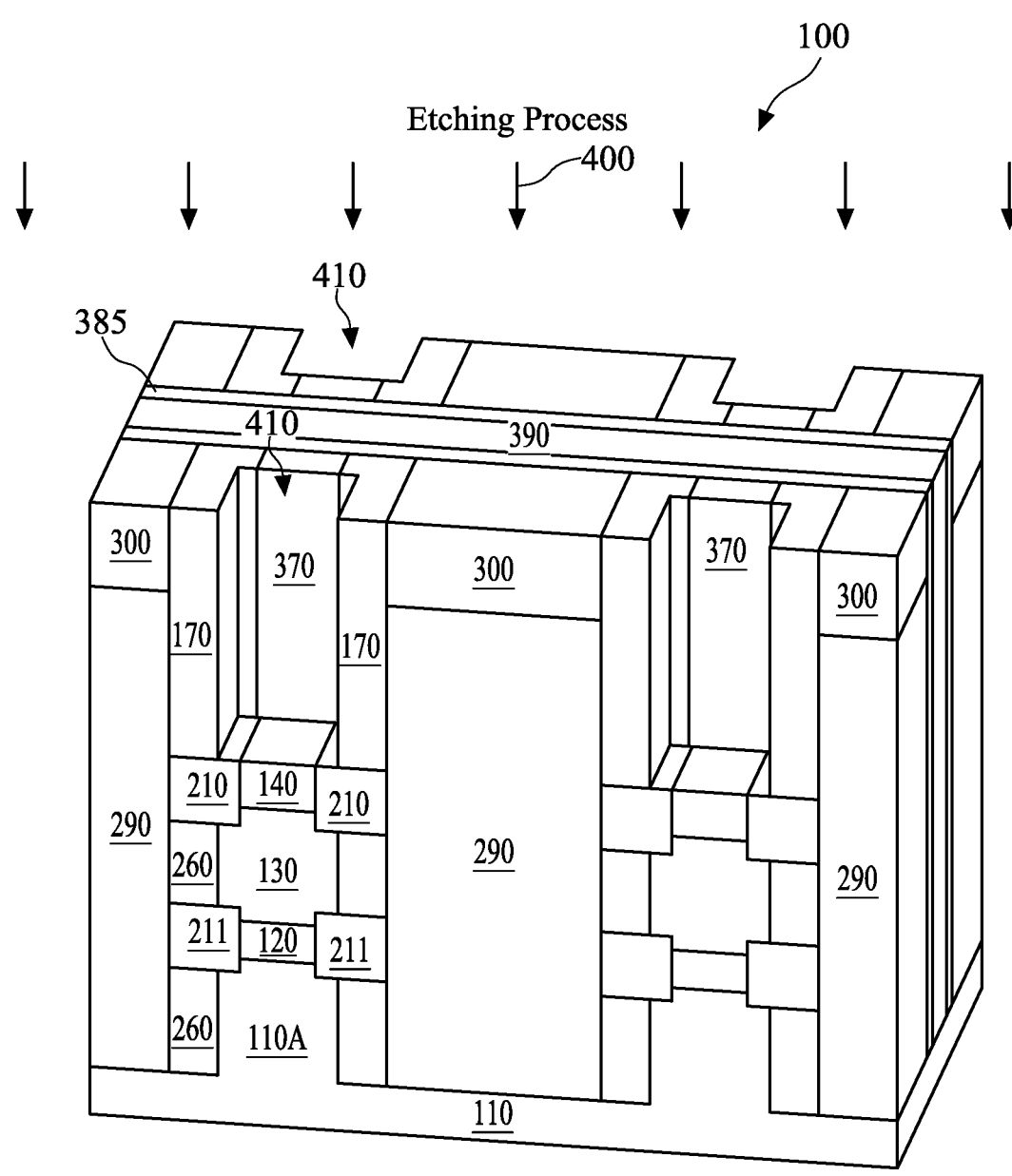

Referring now to FIG. 12A, an etching process 400 is performed to the IC device 100 to form a plurality of openings 410. The etching process 400 is configured to have a sufficient etching selectivity between the materials of the hard masks 160 and the materials of the other components of the IC device 100, such that the hard mask 160 is removed at a substantially faster etching rate. As a result of the etching process 400 being performed, the plurality of openings 410 are formed in place of the removed hard masks 160. It is understood that source/drain components will be formed to fill these openings 410 in a later fabrication process, and as such, the openings 410 may also be interchangeably refer to as source/drain openings. It is also understood that in the context of the present disclosure, a source/drain component (or a source/drain region) may refer to a source or a drain of a transistor, individually or collectively, dependent upon the context. For example, in some embodiments, a drain component may be formed to partially fill each of the openings 410.

Figure 13A:
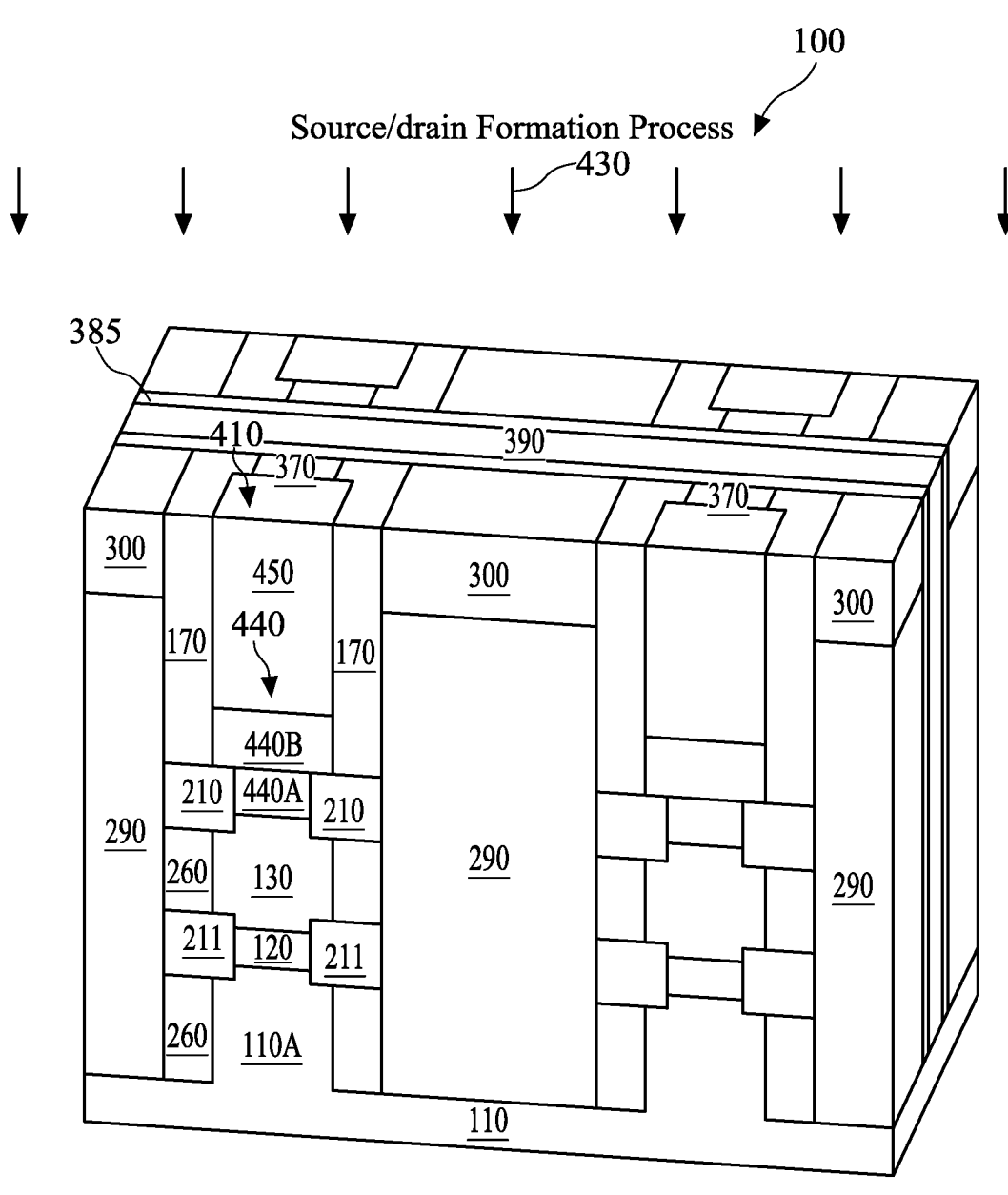

Referring now to FIG. 13A, a source/drain formation process 430 is performed to the IC device 100 to form source/drain components 440 in each of the openings 410. The source/drain formation process 430 includes a plurality of steps. As a first step of the source/drain formation process 430, the semiconductor layers 140 are removed, for example, via an etching process. The removal of the semiconductor layers 140 effectively extends the openings 410 further downwards vertically in the Z-direction. Thereafter, a lightly-doped source/drain (LDD) portion 440A of the source/drain component 440 is formed to fill the opening created by the removal of each of the semiconductor layers 140. In other words, the LDD portion 440A effectively replaces each of the semiconductor layers 140. A heavily doped source/drain portion 440B (e.g., doped more heavily than the LDD portion 440A) of the source/drain component 440 is then formed over the LDD portion 440A to partially fill each of the openings 410. It is understood that the formation of the LDD portion 440A and/or the formation of the heavily doped portion 440B of the source/drain component 440 may each include one or more epitaxial growth and/or doping processes.

In any case, the LDD portion 440A and the heavily doped portion 440B may collectively function as a source/drain component 440 (e.g., as a drain component). After the formation of the source/drain component 440, one or more deposition processes may be performed to form a hard mask 450 to completely fill each of the openings 410. In other words, the hard mask 450 is formed directly over the heavily doped portion 440B of the source/drain component 440 in each of the openings 410.

Figure 14A:
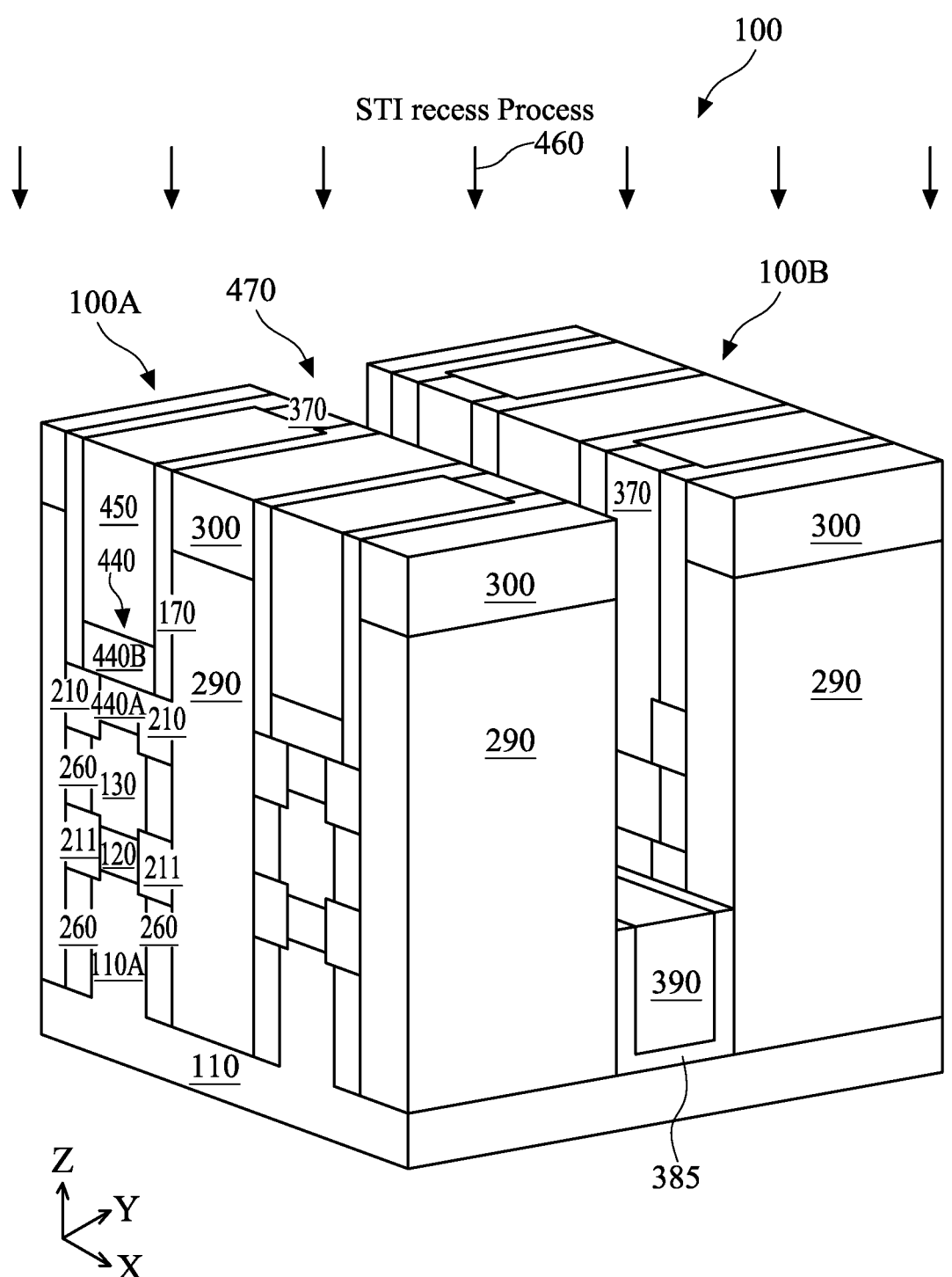

Referring now to FIG. 14A, a STI recess process 460 is performed to the IC device 100 to form an STI recess 470. The STI recess process 460 may include one or more etching processes that are configured to partially remove the liner 385 and the STI structure 390. As a result, the STI recess 470 is formed, where the STI recess 470 extends vertically downwards in the Z-direction and extends horizontally in the X-direction. Thus, the IC device 100 is separated by the opening 470 into the two vertical stacks 100A and 100B again.

For the fabrication stages corresponding to FIGS. 15A-17A (to be discussed below), their corresponding cross-sectional side views are also illustrated as FIGS. 15B-17B, respectively, in order to provide additional clarifying details of the various aspects of the present disclosure. Again, the cross-sectional side views of FIGS. 15B-17B are each taken along a cutline A-A' that spans horizontally in the X-direction, and thus FIGS. 15B-17B may be referred to as X-cut views.

Figure 15A:
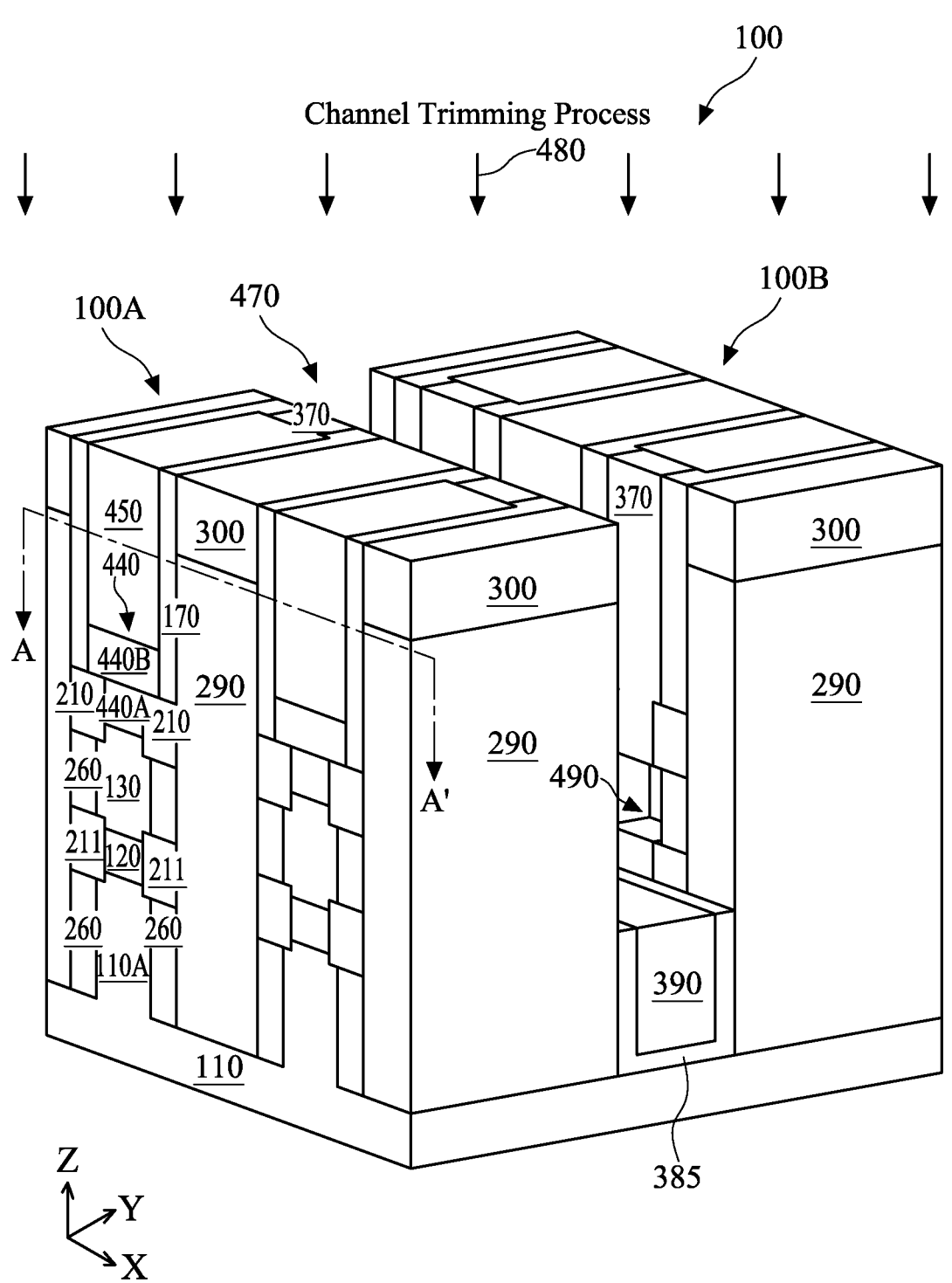
Figure 15B:
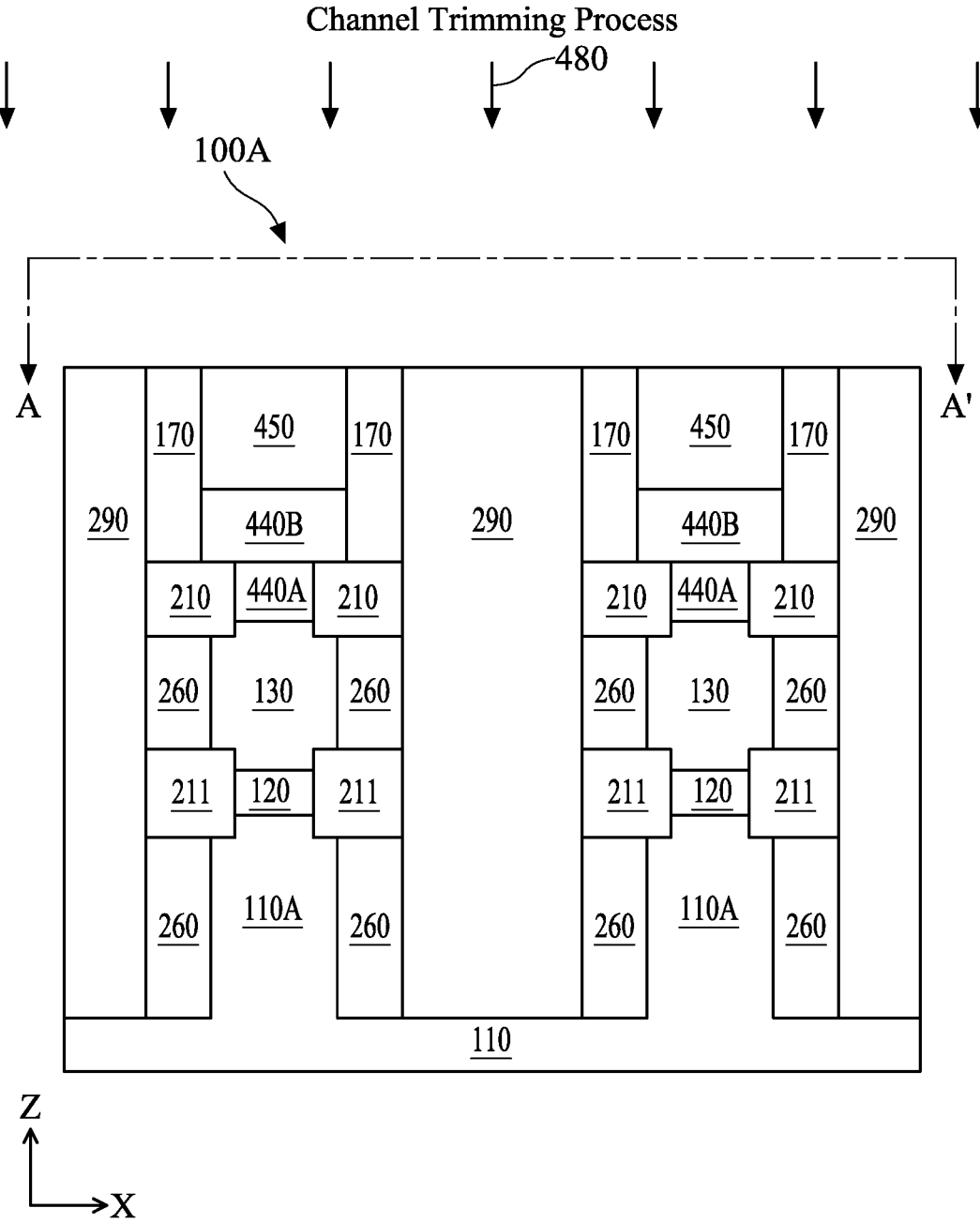

Referring now to FIGS. 15A-15B, a channel trimming process 480 is performed to the IC device 100 to form a plurality of lateral recesses 490. In more detail, the channel trimming process 480 may include one or more etching processes configured with an etching selectivity between the materials of the channel layer 130 (e.g., silicon) and the rest of the components of the IC device 100. As such, the channel layer 130 is etched away at a faster rate without substantially impacting the components of the IC device 100 around the channel layer 130. It is understood that the lateral recesses 490 will be filled by a metal-containing gate structure in a later fabrication process.

It is understood that the lateral recesses 490 are formed in both the vertical stacks 100A and 100B shown in FIG. 15A. While the lateral recess 490 formed in the vertical stack 100B is directly visible, the lateral recess 490 formed in the vertical stack 100A is not directly visible due to the orientation of the three-dimensional perspective view of FIG. 15A. Also note that the removal of the channel layer 130 is not complete: a portion of the channel layer 130 still remains in both the vertical stacks 100A and 100B. This aspect is also clearly demonstrated in the cross-sectional side view of FIG. 15B, where the cross-sectional cut is taken such that the channel layer 130 is visible in FIG. 15B, but the lateral recess 490 is not directly visible in FIG. 15B.

Figure 16A:
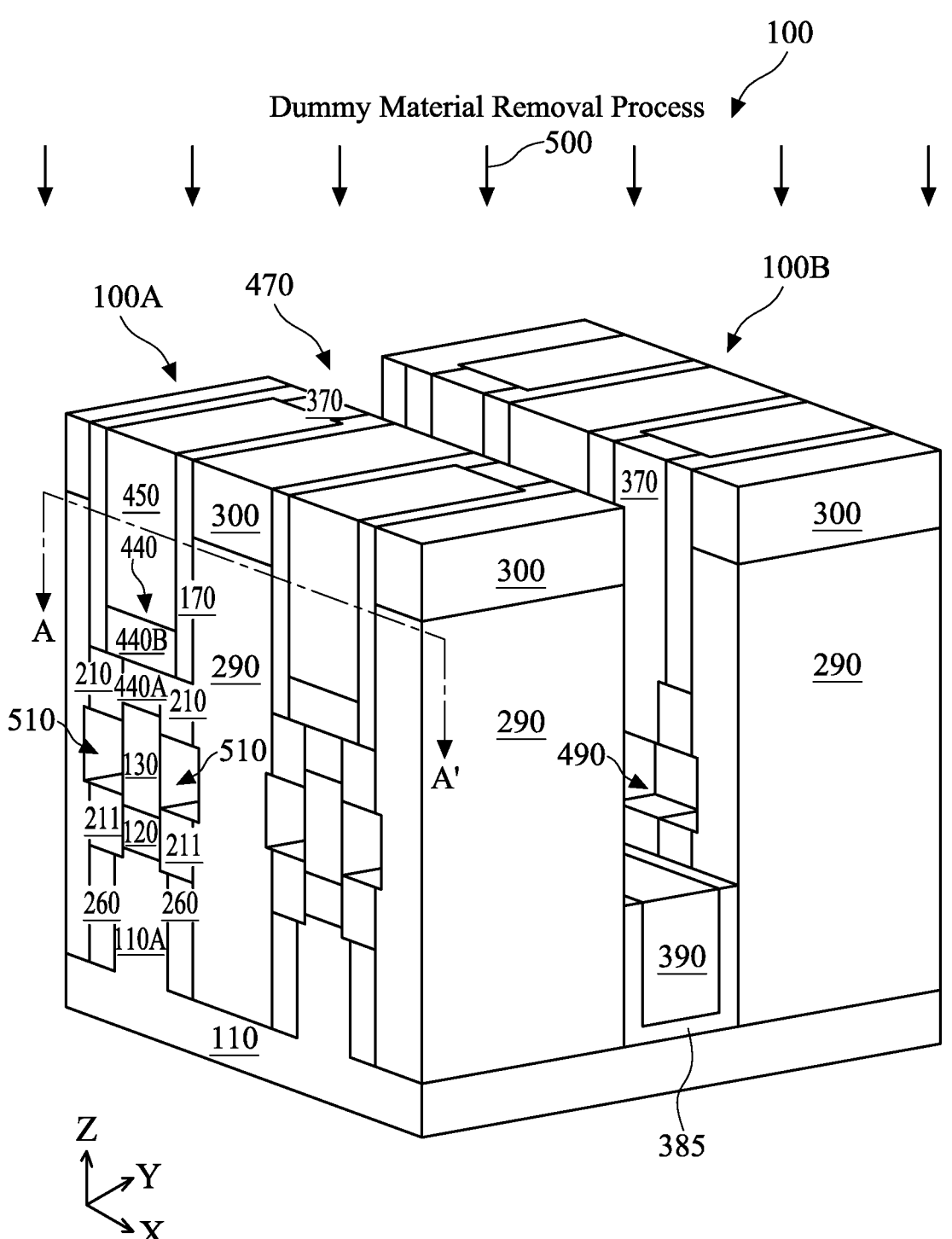
Figure 16B:
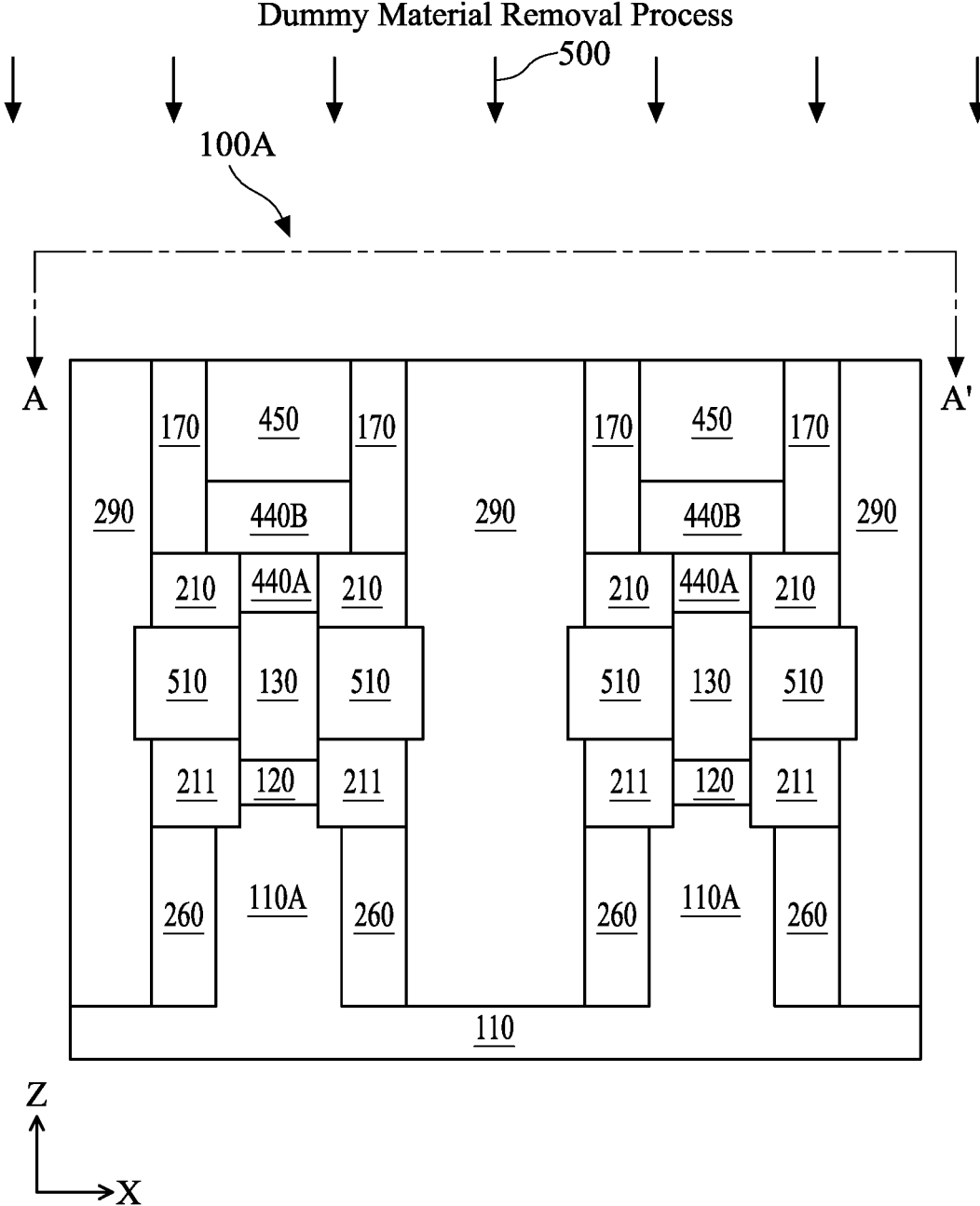

Referring now to FIGS. 16A-16B, a dummy material removal process 500 is performed to the IC device 100 to remove some of the dummy materials 260. The dummy material removal process 500 may include one or more etching processes configured with a sufficient etching selectivity between the dummy materials 260 and the rest of the components of the IC device 100. Note that the etching processes are configured to remove the dummy materials selectively, in that the dummy materials 260 between the top spacers 210 and the bottom spacers 211 are removed, but the dummy materials 260 between the bottom spacers 211 and the substrate 110 are not substantially affected.

As a result of the performance of the selective removal of the dummy materials 260, a plurality of recesses 510 are formed in place of the selectively removed dummy materials 260. In other words, the recesses 510 are located between the top spacers 210 and the bottom spacers 211. One of the unique physical characteristics of the present disclosure is that the recesses 510 each extends beyond the outer sidewalls of the spacers 210 and 211. This is shown in FIG. 16A but is more readily apparently in FIG. 16B. In other words, the sidewall of each recess 510 protrudes more in the X-direction toward the STI structure 290 than the sidewall of the top spacers 210 above the recess 510 or the sidewall of the bottom spacers 211 below the recess 510. The selective removal of the dummy materials 260 also effectively widens or expands the lateral recess 490, as shown in FIG. 16A. The recesses 510, along with the lateral recesses 490, will be filled by a metal-containing gate structure in a later fabrication process.

Figure 17A:
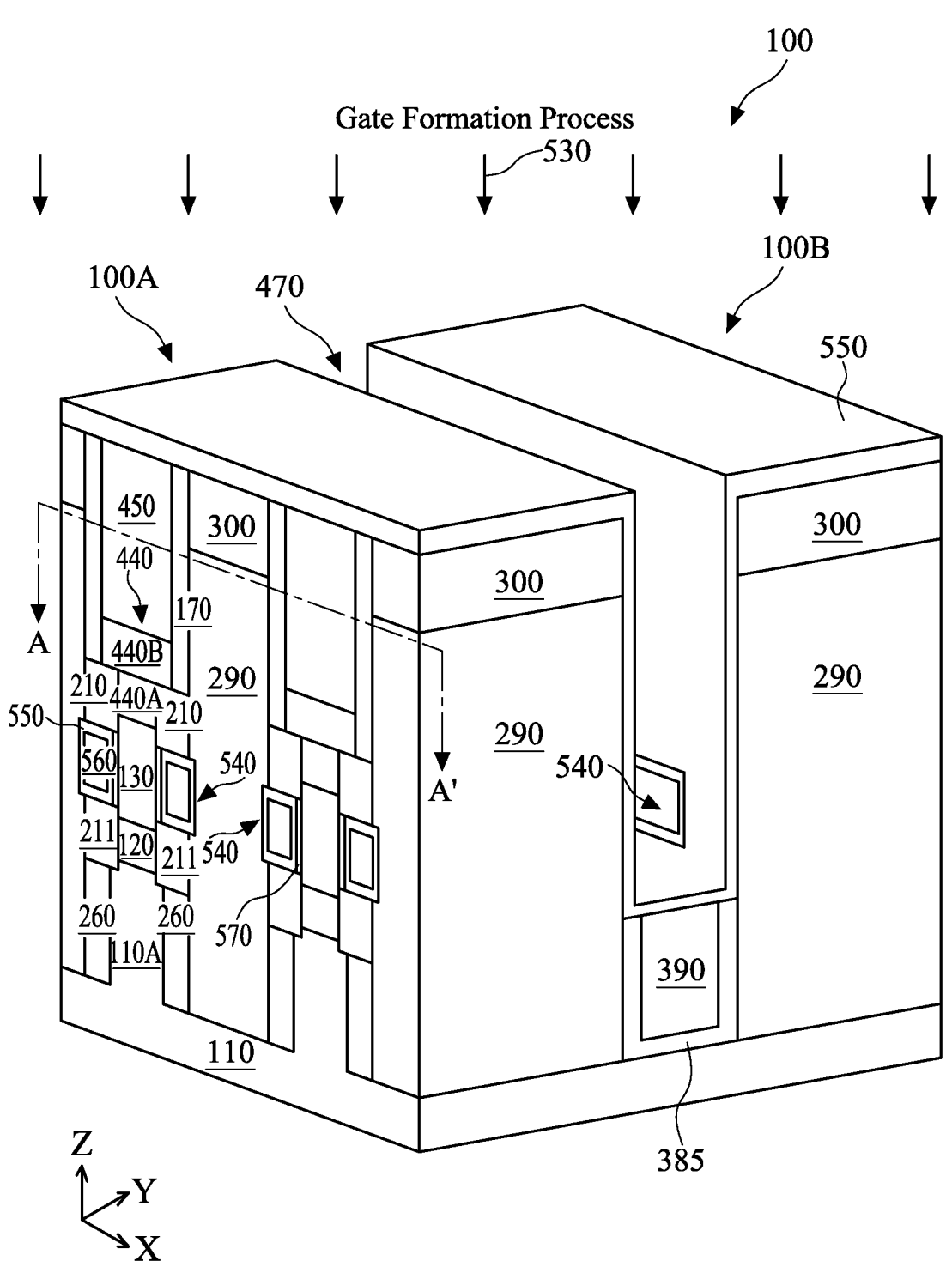
Figure 17B:
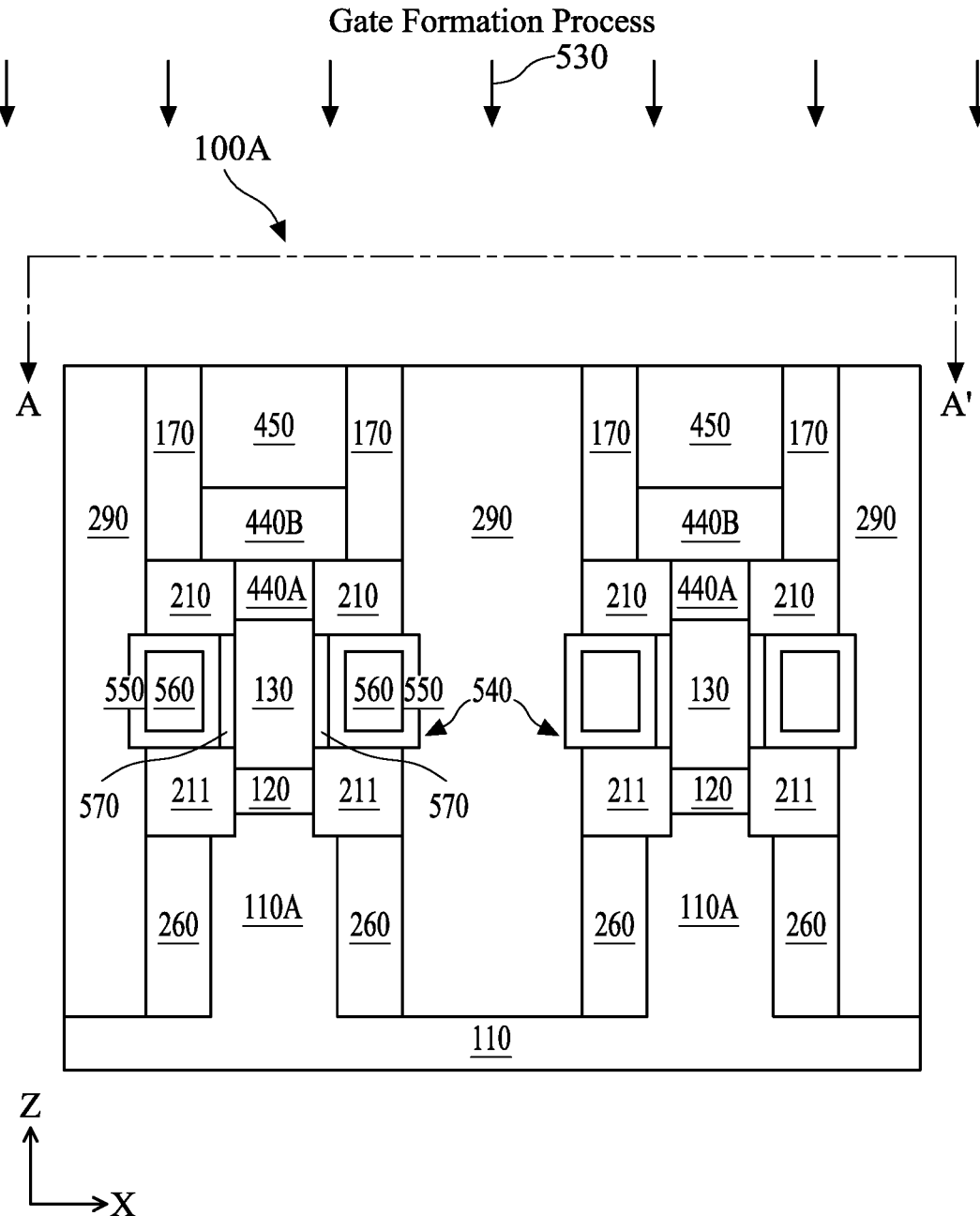

Referring now to FIGS. 17A-17B, a gate formation process 530 is performed to the IC device 100 to form gate structures 540 in the recesses 490 and 510. The gate formation process 530 may include a plurality of deposition processes. For example, a deposition process (e.g., ALD, CVD, PVD, etc.) may be performed to form a gate dielectric layer 550 to partially fill the recesses 490 and 510. As shown in FIG. 17A, portions of the gate dielectric layer 550 may be formed over the spacers 170, the helmet structures 300, the hard masks 450, the STI structures 390, and the liner 385. In other words, portions of the gate dielectric layer 550 may be formed to partially fill the STI recess 470, in addition to filling the recesses 490 and 510. However, these portions of the gate dielectric layer 550 may be partially removed in a later process.

In some embodiments, the gate dielectric layer 550 includes a high-k dielectric material, which refers to a dielectric material having a dielectric constant that is greater than a dielectric constant of silicon oxide (e.g., which is about 3.9). Example materials of the high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof.

As another step of the gate formation process 530, one or more deposition processes may be performed to form a gate electrode 560 in the recesses 490 and 510. The gate electrode 560 may be a metal-containing gate electrode. For example, the gate electrode 560 may include one or more work function (WF) metal layers and a fill metal layer. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as the main conductive portion of the metal-containing gate electrode. In some embodiments, the fill metal layer may include cobalt, tungsten, copper, aluminum, or alloys or combinations thereof. For reasons of simplicity, the WF metal layers and the fill metal layers are not separately illustrated or separately labeled herein.

One of the unique characteristics of the present disclosure is the relative disposition between the gate dielectric layer 550 and the gate electrode 560. Specifically, the gate electrode 560 is circumferentially surrounded by the gate dielectric layer 550. For example, as shown in the cross-sectional side view of FIG. 17B, the gate electrode 560 is surrounded by the gate dielectric layer 550 in 360 degrees. That is, all sides (e.g., top side, bottom side, left side, and right side) of the gate electrode 560 is in direct contact with the gate dielectric layer 550. In contrast, IC devices fabricated according to other process flows typically have a gate electrode that is only partially surrounded by a gate dielectric layer (e.g., the gate electrode is surrounded on the bottom side but not on the top side).

Such a distinct physical arrangement between the gate electrode 560 and the gate dielectric layer 550 herein is an inherent result of the unique fabrication process flow of the present disclosure. For example, it is an inherent result of the formation of the recesses 490 and 510 (which are filled by the gate dielectric layer 550 and the gate electrode 560), where the recesses 510 are defined at least in part by the top spacers 210 and the bottom spacers 211, which are defined by the lateral etching of the semiconductor layers 140 and 120, respectively. Had the formation of the gate structures 540 not been confined (on the top side) by the top spacers 210, the gate dielectric layer 550 would not have been formed on the bottom-facing surface of the top spacer 210, and consequently the top surface of the gate electrode 560 would not have come into direct contact with the gate dielectric layer 550.

Another unique characteristic of the gate structure 540 of the present disclosure is that it protrudes laterally outward in the X-direction. This characteristic is clearly illustrated in the cross-sectional side view of FIG. 17B, where a side surface of the gate dielectric layer 550 protrudes further into the STI structure 290 than side surfaces of the top spacer 210 and the bottom spacer 211. Such a lateral protrusion may also be an inherent result of the unique fabrication process flow of the present disclosure. For example, existing gate formation process flows may not involve filling a lateral recess (e.g., such as the recesses 510 shown in FIGS. 16A-16B), whereas the gate structure 540 of the present disclosure is formed by filling such lateral recesses 510. Consequently, when the lateral recesses 510 are etched to slightly protrude into the nearby STI structure 290, it would inherently result in the lateral protrusion of the gate structures 540 in the X-direction as well.

It is understood that each of the gate structures 540 may include additional layers, such as interfacial layers, capping layers, diffusion/barrier layers, or other applicable layers. For example, an interfacial layer 570 may be optionally formed between the gate dielectric layer 550 and the channel layer 130 in the X-direction. In some embodiments, the interfacial layer 570 may be formed at least in part by reacting an oxide layer and a metal oxide layer in a spontaneous reaction at a relatively low temperature, such as a temperature below about 100 degrees Celsius (e.g., between about 0 degrees Celsius and about 50 degrees Celsius). In some embodiments, the interfacial layer 570 may include a metal germanium oxide ($M_xGe_yO_z$), a metal silicon oxide ($M_xSi_yO_z$), or a metal germanium silicon oxide ($M_xGe_y$-$Si_zO_1$). It is understood that x, y, z, 1 in each of the chemical formulas above may be a positive integer, and the values of them may be different in each case. In some embodiments, the metal (M) in the interfacial layer 570 may include Al, Y, Ga, Sc, La, Ce, Pr, Nd, Pm, Sm, Eu, Gd, Tb, Dy, Ho, Er, Tm, Yb, or Lu. In some other embodiments, the interfacial layer 570 is made of a ternary compound. For reasons of simplicity, other layers of the gate structures 540 are not specifically illustrated herein.

Figure 18A:
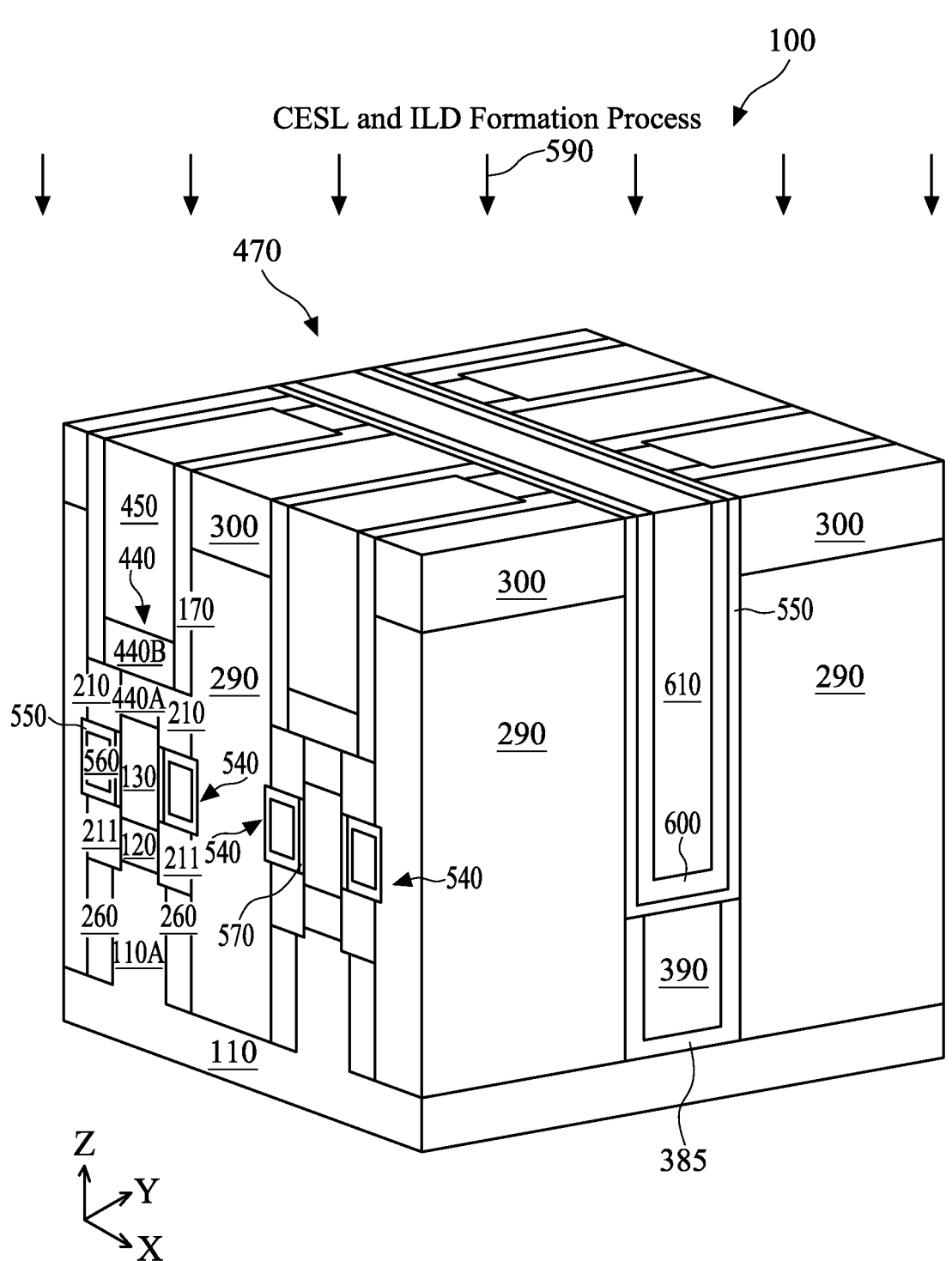

Referring now to FIG. 18A, the portions of the gate dielectric layer 550 formed on the upper surfaces of the vertical stacks 100A and 100B are removed, and then a CESL and ILD formation process 590 is performed to the IC device 100 to form a contact etching stop layer (CESL) 600 and an interlayer dielectric (ILD) 610. The CESL 600 and the ILD 610 are both formed in the STI recess 470. The CESL 600 is formed directly on the gate dielectric layer 550, and the ILD 610 is formed directly on the CESL 600. In some embodiments, the CESL 600 and the ILD 610 may include different types of dielectric materials.

Figure 19A:
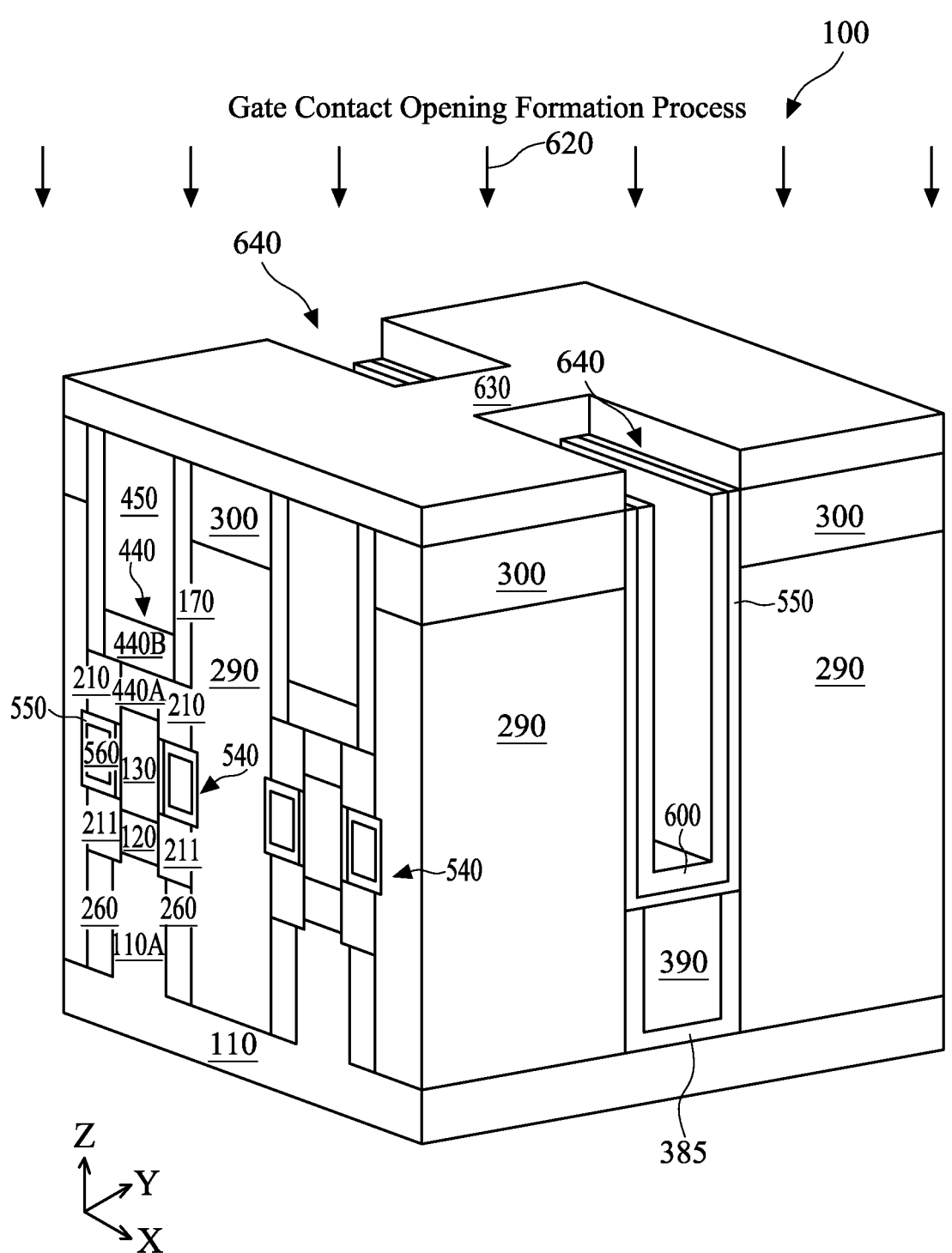

Referring now to FIG. 19A, a gate contact opening formation process 620 is performed to the IC device 100. First, an ILD 630 is formed over the IC device 100 (including over the ILD 610) via a deposition process. Thereafter, a patterning process may be performed to define a plurality of openings in the ILD 630. The openings are then extended downwardly in the Z-direction through one or more etching processes. Portions of the ILD 610 exposed by the openings are etched away. This process continues until the CESL 600 has been reached. As this point, gate contact openings 640 are formed.

Figure 20A:
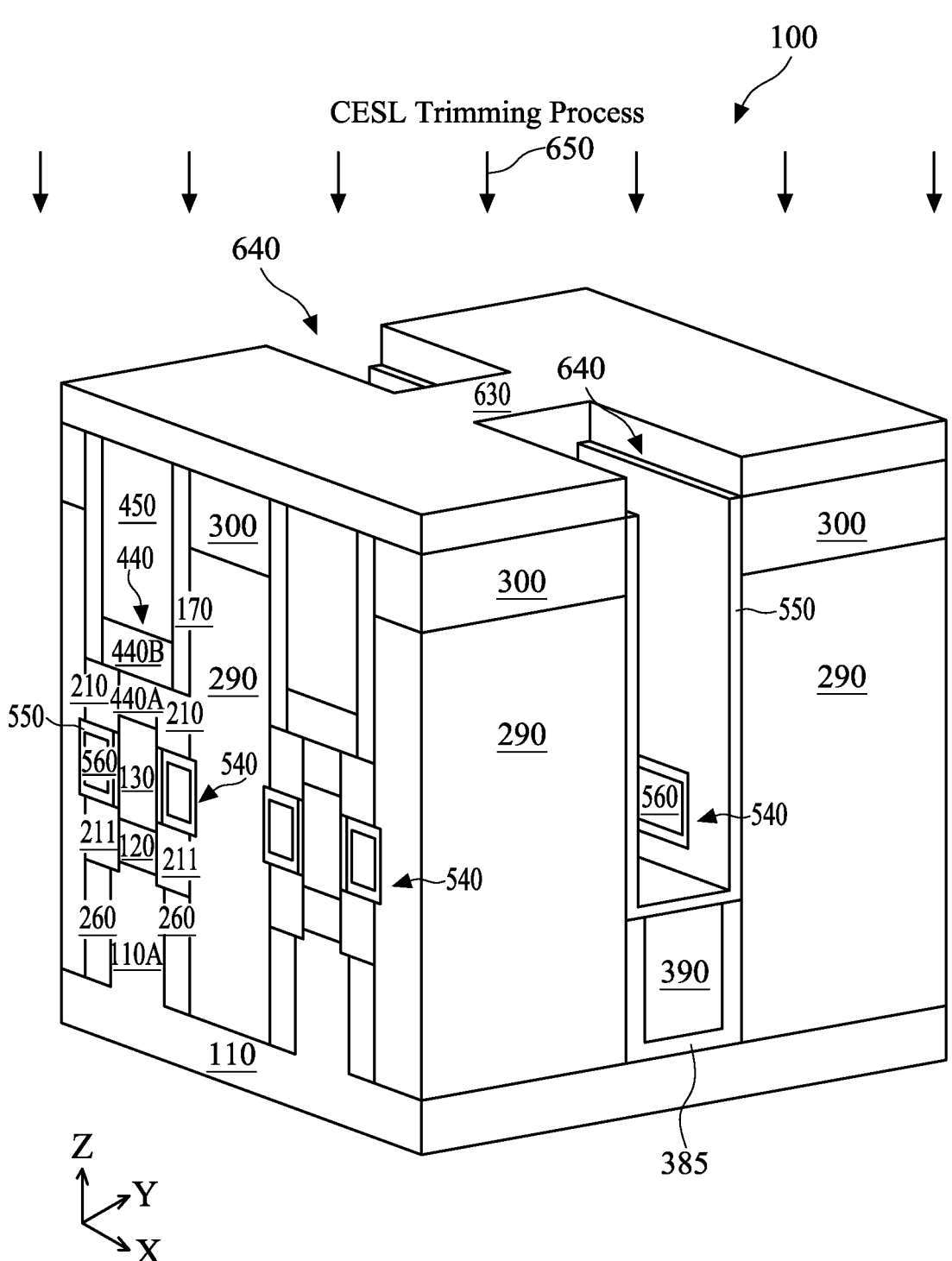

Referring now to FIG. 20A, a CESL trimming process 650 is performed to the IC device 100. The CESL trimming process 650 may include one or more etching processes to remove portions of the CESL 600 within the gate contact openings 640. Note that the removal of the CESL 600 exposes portions of the gate structure 540, for example, the side surfaces of the gate electrode 560 within the gate contact opening 640.

Figure 21A:
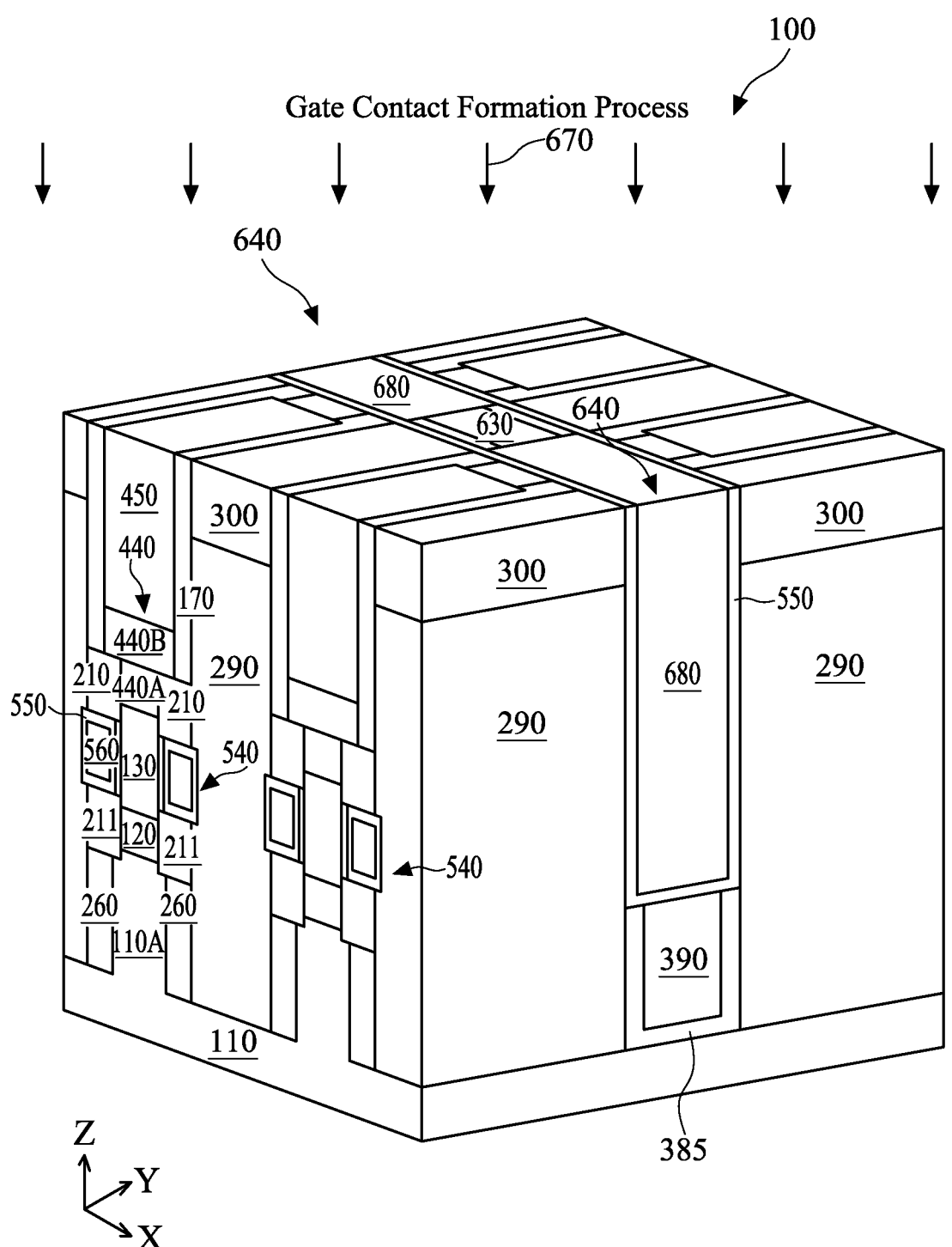

Referring now to FIG. 21A, a gate contact formation process 670 is performed to the IC device 100 to form a plurality of gate contacts 680 in the gate contact openings 640. The gate contacts 680 may be formed by one or more deposition processes to deposit one or more conductive materials (e.g., aluminum, copper, tungsten, cobalt, etc.) into the gate contact opening 640, and thereafter performing a planarization process (e.g., a CMP process) to the deposited conductive materials. The gate contacts 680 are electrically connected to the gate structures 540 and therefore provide electrical connectivity to the gate structures 540. Note that the ILD 630 is removed after (or before) the formation of the gate contacts 680.

Figure 22A:
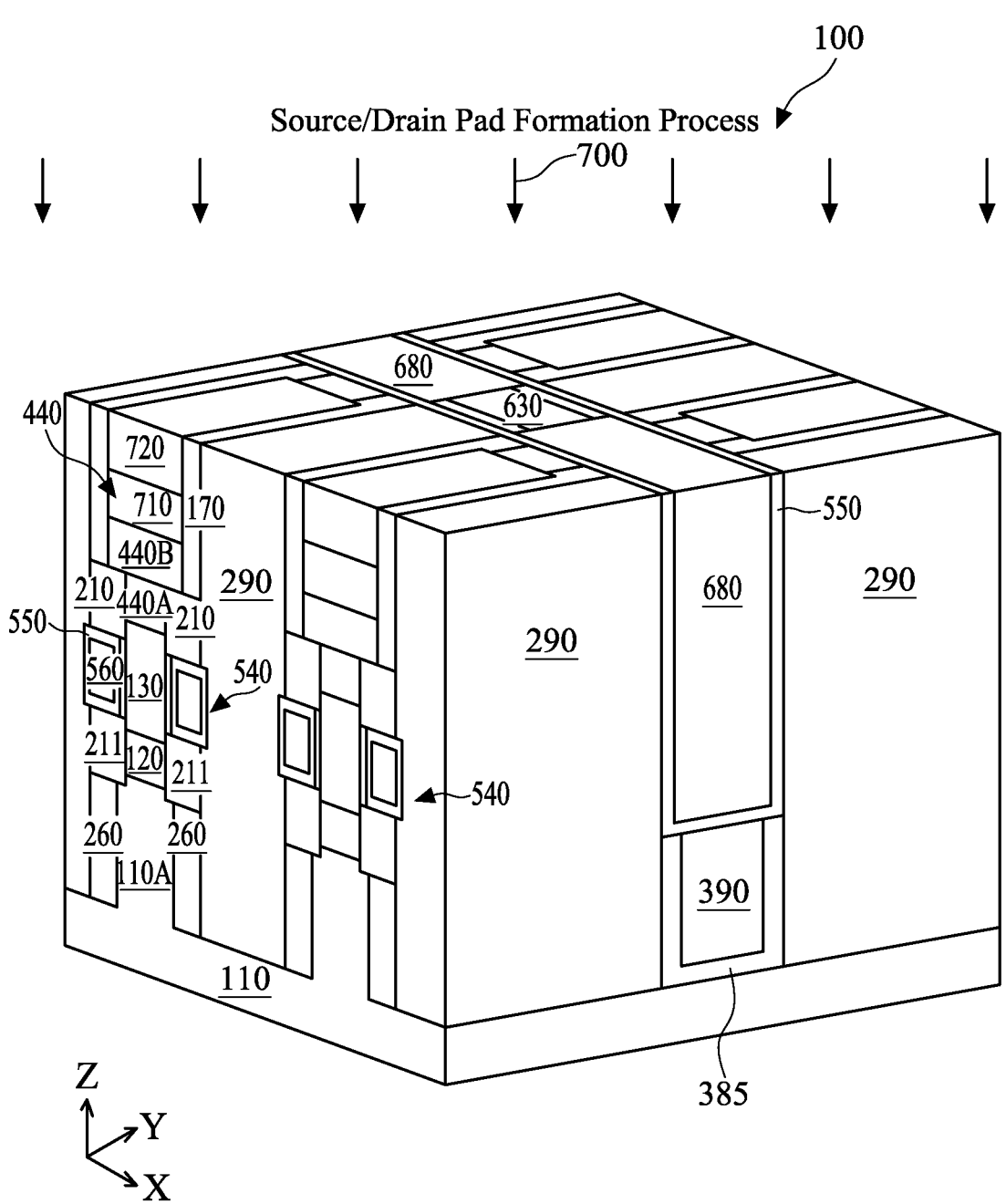

Referring now to FIG. 22A, a source/drain pad formation process 700 is performed to the IC device 100 to form a plurality of source/drain pads 720. As a first part of the source/drain pad formation process 700, the hard masks 450 are removed, for example, via one or more etching processes. The removal of the hard masks 450 leave sourced/drain pad openings above the heavily doped source/drain components 440B. As a second part of the source/drain pad formation process 700, a silicide layer 710 is formed on each of the heavily doped source/drain components 440B, and then the source/drain pad 720 is formed over each of the silicide layers 710. The source/drain pads 720 may be formed by one or more deposition processes to deposit one or more conductive materials (e.g., aluminum, copper, tungsten, cobalt, titanium, or combinations thereof etc.) into the source/drain pad opening (e.g., completely filling the source/drain pad opening), and thereafter performing a planarization process (e.g., a CMP process) to the deposited conductive materials. The source/drain pads 720 are electrically coupled to the source/drain components 440 and therefore provide electrical connectivity to the source/drain components 440.

Note that since the source/drain component 440 is a drain component in the illustrated embodiment, the source/drain pad 720 may be interchangeably referred to as a drain pad 720. Also note that the helmet structure 300 may be removed after (or before) the formation of the source/drain pads 720, such that the upper surfaces of the source/drain pads 720 may be substantially co-planar with the upper surfaces of the STI structure 290.

Figure 23A:
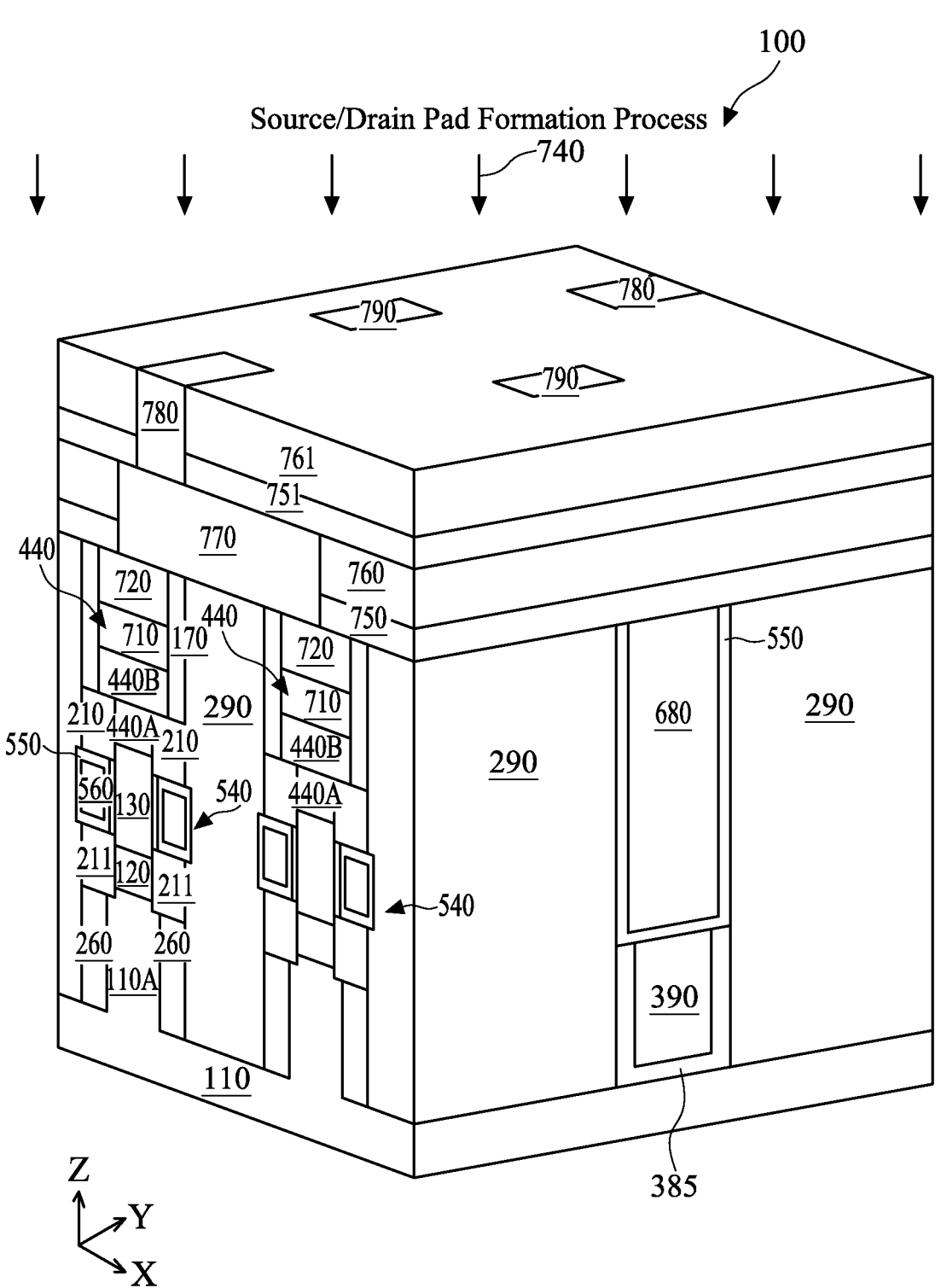

Referring now to FIG. 23A, a plurality of metallization process 740 is performed to the IC device 100 to form a plurality of metallization components. First, an etching stop layer 750 is formed over the IC device 100, including over the source/drain pads 720. An ILD 760 is then formed over the etching stop layer 750. The ILD 760 and the etching stop layer 750 may include different types of dielectric materials. Thereafter, a patterning process is performed to form a plurality of source/drain contact openings that each extends vertically through the ILD 760 and the etching stop layer 750. The source/drain contact openings at least partially expose each of the source/drain pads 720 shown in FIG. 23A. The source/drain contact openings are then filled with a conductive material (e.g., aluminum, copper, tungsten, cobalt, titanium, or combinations thereof etc.) to form source/drain contacts 770 (one of which isn't directly visible in FIG. 23A). The source/drain contacts 770 are electrically coupled to the source/drain components 440, for example, through the source/drain pads 720.

Subsequently, an etching stop layer 751 is formed over the source/drain contact 770 and over the ILD 760. An ILD 761 is then formed over the etching stop layer 751. The ILD 761 and the etching stop layer 751 may include different types of dielectric materials. Thereafter, a patterning process is performed to form a plurality of via openings that each extends vertically through the ILD 761 and the etching stop layer 751. For example, a plurality of source/drain via openings at least partially expose the source/drain contact 770, and a plurality of gate via openings at least partially expose the gate contacts 680 (see FIG. 22A). These openings are then filled with a conductive material (e.g., aluminum, copper, tungsten, cobalt, titanium, or combinations thereof etc.) to form a plurality of source/drain vias 780 and a plurality of gate vias 790. The source/drain vias 780 are electrically coupled to the source/drain components 440, for example, through the source/drain pads 720 and the source/drain contacts 770, and the gate vias 790 are electrically coupled to the gate structures 540, for example, through the gate contacts 680.

Figure 24A:

Referring now to FIG. 24A, a de-mesa process 800 is performed to the IC device 100 from the bottom side. The de-mesa process 800 includes one or more etching processes that etch away the substrate 110 and the active regions 110A until the bottom-facing surfaces of the semiconductor layers 120 are exposed. As a result, a plurality of recesses 810 are formed in the IC device 100, where each of the recesses 810 is defined by the bottom-facing surface of the semiconductor layer 120 and the sidewalls of the dummy materials 260.

Figure 25A:
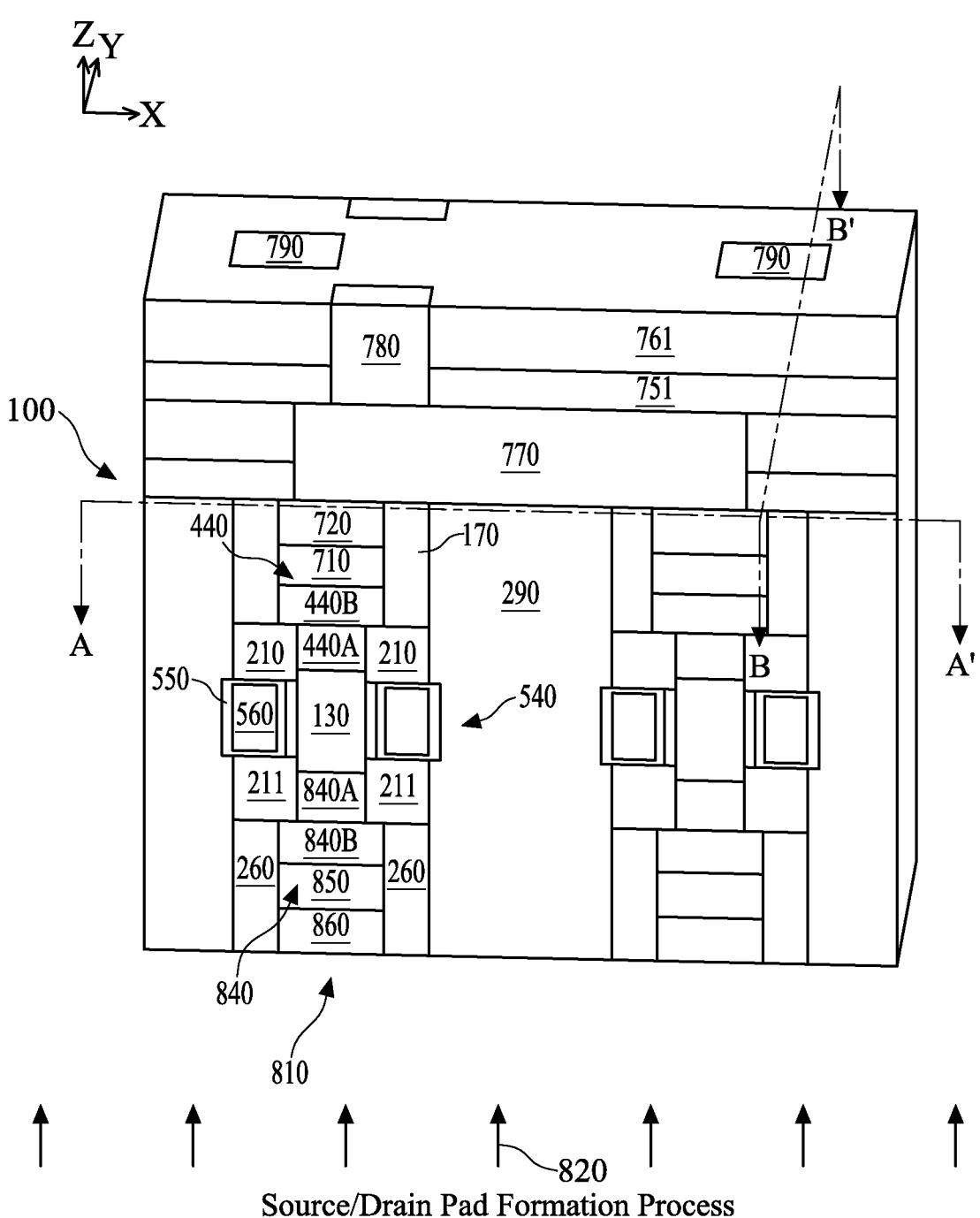

Referring now to FIG. 25A, a source/drain formation process 820 is performed to the IC device 100 to form a plurality of source/drain components 840 in each of the recesses 810. The source/drain formation process 820 includes a plurality of steps. As a first step of the source/drain formation process 820, the semiconductor layers 120 are removed, for example, via an etching process. The removal of the semiconductor layers 120 effectively extends the recesses 810 further upwards vertically in the Z-direction. Thereafter, a lightly-doped source/drain (LDD) portion 840A of the source/drain component 840 is formed to fill the opening created by the removal of each of the semiconductor layers 120. In other words, the LDD portion 840A effectively replaces each of the semiconductor layers 120.

A heavily doped source/drain portion 840B (e.g., doped more heavily than the LDD portion 840A) of the source/drain component 840 is then formed over the LDD portion 840A to partially fill each of the recesses 810. It is understood that the formation of the LDD portion 840A and/or the formation of the heavily doped portion 840B of the source/drain component 440 may each include one or more epitaxial growth and/or doping processes. In any case, the LDD portion 840A and the heavily doped portion 840B may collectively function as a source/drain component 840 (e.g., as a source component).

After the formation of the source/drain component 840, a silicide layer 850 is formed on the bottom-facing surface of each of the heavily doped source/drain components 840B, and then a source/drain pad 860 is formed on each of the silicide layers 850. The source/drain pads 860 may be formed by one or more deposition processes to deposit one or more conductive materials (e.g., aluminum, copper, tungsten, cobalt, titanium, or combinations thereof etc.) into the recesses 810 (e.g., completely filling the recesses 810), and thereafter performing a planarization process (e.g., a CMP process) to the deposited conductive materials.

The source/drain pads 860 are electrically coupled to the source/drain components 840 and therefore provide electrical connectivity to the source/drain components 840. Note that since the source/drain component 840 is a source component in the illustrated embodiment, the source/drain pad 860 may be interchangeably referred to as a source pad 860. Note that the fact that the source components 840 are formed after the drain components 440 is another unique aspect of the present disclosure. In many other implementations of a GAA device, the source components and drain components are often formed at the same time, unlike the present disclosure.

It is understood that additional fabrication processes may be performed to continue the fabrication of the IC device 100, such as the formation of source vias or other metallization features, packaging processes, testing processes, etc. For reasons of simplicity, these additional processes are not specifically discussed in detail herein.

Figure 26:
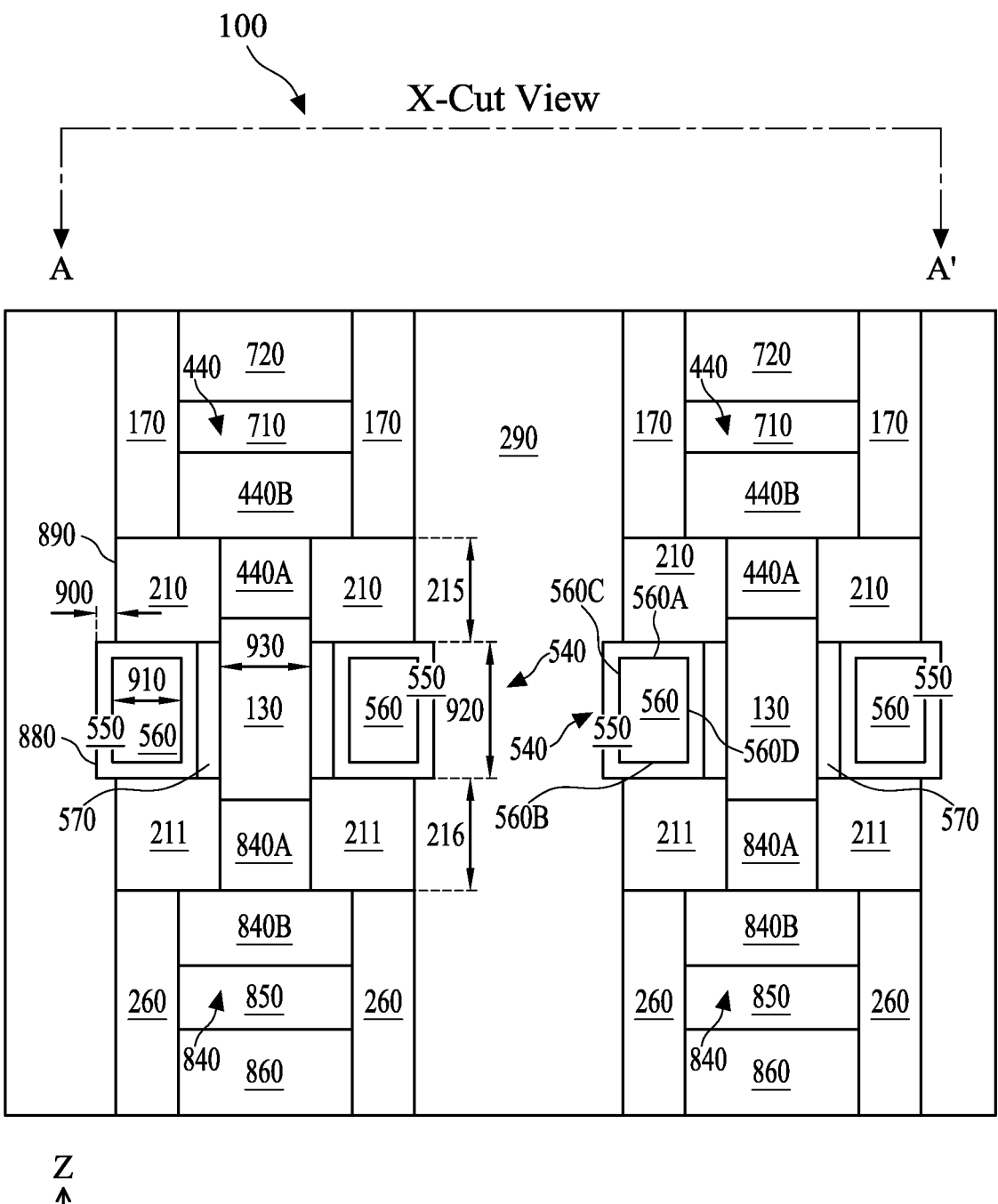
FIGS. 26-27 illustrate different cross-sectional side views of an IC device according to embodiments of the present disclosure.
Figure 27:
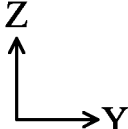

FIGS. 26 and 27 are different cross-sectional side views of portions of the IC device 100 that illustrate various aspects of the present disclosure in greater detail. Specifically, FIG. 26 illustrates a cross-sectional side view of the IC device 100 at a plane defined by the X-direction and the Z-direction (e.g., an X-cut view), and FIG. 27 illustrates a cross-sectional side view of the IC device 100 at a plane defined by the Y-direction and the Z-direction (e.g., a Y-cut view). For example, FIG. 26 is taken at a cutline A-A' shown in FIG. 25A, and FIG. 27 is taken at a cutline B-B' shown in FIG. 25A.

Referring now to the X-cut cross-sectional side view of FIG. 26, one of the unique characteristics of the IC device 100 is that the gate electrode 560 is surrounded on all sides by the gate dielectric layer 550. For example, the gate dielectric layer 550 is in direct physical contact with a top surface 560A, a bottom surface 560B, a side surface 560C (facing the STI structure 290), and a side surface 560D (facing the channel layer 130) of the gate electrode 560. As such, the gate dielectric layer 550 surrounds the gate electrode 560 circumferentially in 360 degrees in the X-cut cross-sectional side view of FIG. 26. As discussed above, such a circumferential surrounding of the gate electrode 560 by the gate dielectric layer 550 is one of the inherent results of the unique fabrication process flow of the present disclosure and may be evidence of the performance of the unique fabrication process flow discussed above. For example, the fact that the top surface 560A and the bottom surface 560B of the gate electrode 560 are in direct physical contact with the gate dielectric layer 550 is an inherent result of the gate structure 540 being formed within (or being confined by) the top spacer 210 and the bottom spacer 211.

Note that in the Y-cut cross-sectional side view of FIG. 27, the gate electrode 560 is not surrounded on all sides by the gate dielectric layer 550. Instead, while the side surface 560D, the top surface 560A, and the bottom surface 560B of the gate electrode 560 are in direct physical contact with the gate dielectric layer 550, a side surface 560E of the gate electrode 560 is in direct physical contact with the gate contact 680 in this Y-cut view. In other words, the gate dielectric layer 550 surrounds the gate electrode 560 by less than 360 degrees in the Y-cut cross-sectional side view of FIG. 27. Nevertheless, the profile of the gate structure 540 in the Y-cut cross-sectional side view is also unique, since gate structures in conventional GAA devices may not have both the top surface and the bottom surface of its gate electrode come into direct contact with the gate dielectric layer.

Also as discussed above, another one of the unique characteristics of the gate structure 540 is that it protrudes laterally outwards in the X-cut cross-sectional side view of FIG. 26. For example, a surface 880 of the gate structure 540 (which corresponds to a side surface of the gate dielectric layer 550) extends beyond the side surface 890 of the top spacer 210 by a distance 900 in the X-direction. In some embodiments, the distance 900 is greater than 0 and is in a range between about 0.01 nanometers and about 10 nanometers. The lateral protrusion of the gate structure 540 is also one of the inherent results of the unique fabrication process flow of the present disclosure.

Still referring to FIG. 26, the gate electrode 560 has a horizontal dimension 910 (measured in the X-direction, see FIG. 26), and the gate structure 540 overall has a vertical dimension 920 (measured in the Z-direction, see FIG. 26). In some embodiments, the horizontal dimension 910 is in a range between about 4 nanometers and about 15 nanometers, and the vertical dimension 920 is in a range between about 8 nanometers and about 25 nanometers. The vertical dimension 920 may also be referred to as a gate length. The gate length (i.e., the vertical dimension 920) can also be precisely controlled according to various aspects of the present disclosure, since it is directly correlated to (or determined by) the thickness 135 of the channel layer 130 (see FIGS. 1A-1B), which can be finely controlled during the deposition of the channel layer 130.

Another one of the unique aspects of the present disclosure is that the sizes of the top spacers 210 and the bottom spacers 211 can be more precisely controlled. This is because the thicknesses 215 and 216 (see FIGS. 3A-3B) of the top spacers 210 and the bottom spacers 211 are defined at least in part via the depositions of the semiconductor layers 140 and 120 (see FIGS. 1A-1B), which can be fined controlled (e.g., using ALD). The precise control of the thicknesses 215 and 216 of the top spacers 210 and the bottom spacers 211 reduces undesirable spacer size variations from device-to-device, thereby increasing device uniformity and/or performance. In some embodiments, the thickness 215 and the thickness 216 are each in a range between about 4 nanometers and about 15 nanometers. The top spacers 210 are separated from each other by a distance 930 (measured in the X-direction), which also corresponds to a lateral dimension of the channel layer 130. In some embodiments, the distance 930 is in a range between about 3 nanometers and about 15 nanometers. It is understood that the bottom spacers 211 may also be separated from one another by a similar distance as the distance 930.

FIG. 28 is a flowchart illustrating a method 1000 of fabricating a semiconductor device. The method 1000 includes a step 1010 to form a vertically protruding structure. The vertically protruding structure includes a substrate, a first semiconductor layer disposed over the substrate, a channel layer disposed over the first semiconductor layer, and a second semiconductor layer disposed over the channel layer. The first semiconductor layer and the second semiconductor layer each contain a first type of semiconductive material. The channel layer contains a second type of semiconductive material different from the first type. In some embodiments, the forming the vertically protruding structure comprises: depositing the first semiconductor layer over the substrate; depositing the channel layer over the first semiconductor layer; depositing the second semiconductor layer over the channel layer; and patterning the second semiconductor layer, the channel layer, the first semiconductor layer, and the substrate into a plurality of vertically protruding structures that includes the vertically protruding structure.

The method 1000 includes a step 1020 to form first recesses in the first semiconductor layer and the second semiconductor layer. Each of the first recesses protrudes laterally inward.

The method 1000 includes a step 1030 to fill the first recesses with dielectric spacers.

The method 1000 includes a step 1040 to laterally trim the channel layer and the substrate. The remaining portions of the channel layer and the dielectric spacers define second recesses that protrude laterally inward.

The method 1000 includes a step 1050 to form gate structures in the second recesses. In some embodiments, the forming the gate structures comprises: forming a dummy material in each of the second recesses; replacing the second semiconductor layer with a portion of a first source/drain component; and thereafter replacing the dummy material in each of the second recesses with a metal-containing gate structure. In some embodiments, the metal-containing gate structure in each of the second recesses is formed to protrude laterally beyond the dielectric spacers in a cross-sectional side view. In some embodiments, the forming the metal-containing gate structure comprises: forming a gate dielectric layer as a part of the metal-containing gate structure in each of the second recesses; and forming a metal-containing gate electrode in each of the second recesses, wherein the metal-containing gate electrode is surrounded in 360 degrees by the gate dielectric layer in a cross-sectional side view.

It is understood that additional steps may be performed before, during, or after the steps 1010-1050. For example, in some embodiments, the method 1000 may further include a step of: after the metal-containing gate structure has been formed in each of the second recesses, replacing the first semiconductor layer with a portion of a second source/drain component. As another example, the method 1000 may further include a step of: after the first source/drain component is formed but before the second source/drain component is formed, forming a conductive gate contact beside the gate structures, wherein the conductive gate contact is in direct contact with side surfaces of the gate structures. As a further example, the method 1000 may include a step of: before the second source/drain component is formed, forming conductive source/drain pads over the first source/drain component. Other steps may include packaging and testing steps. For reasons of simplicity, these additional processes are not discussed herein in detail.

Figure 29:
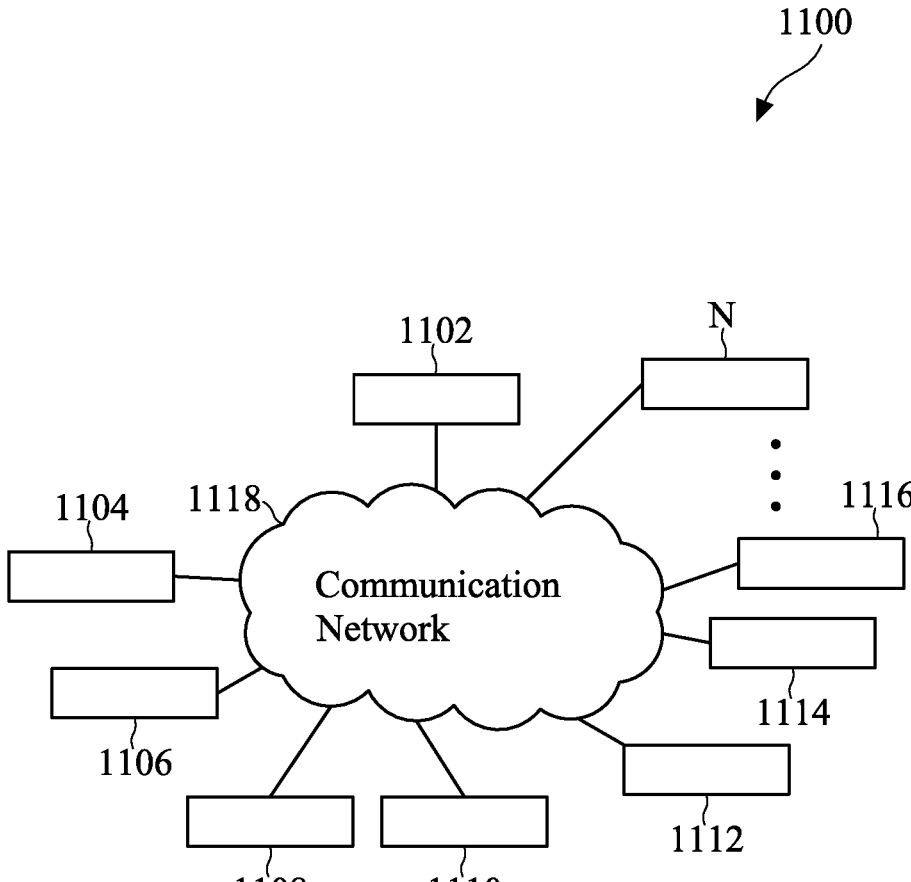
FIG. 29 illustrates an integrated circuit fabrication system according to various aspects of the present disclosure.

FIG. 29 illustrates an integrated circuit fabrication system 1100 according to embodiments of the present disclosure. The fabrication system 1100 includes a plurality of entities 1102, 1104, 1106, 1108, 1110, 1112, 1114, 1116 . . . , N that are connected by a communications network 1118. The network 1118 may be a single network or may be a variety of different networks, such as an intranet and the Internet, and may include both wire line and wireless communication channels.

In an embodiment, the entity 1102 represents a service system for manufacturing collaboration; the entity 1104 represents an user, such as product engineer monitoring the interested products; the entity 1106 represents an engineer, such as a processing engineer to control process and the relevant recipes, or an equipment engineer to monitor or tune the conditions and setting of the processing tools; the entity 1108 represents a metrology tool for IC testing and measurement; the entity 1110 represents a semiconductor processing tool, such the processing tools to perform the various deposition processes discussed above; the entity 1112 represents a virtual metrology module associated with the processing tool 1110; the entity 1114 represents an advanced processing control module associated with the processing tool 1110 and additionally other processing tools; and the entity 1116 represents a sampling module associated with the processing tool 1110.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 1114 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 1100 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 1100 may enable collaboration and information access in such areas as design, engineering, and processing, metrology, and advanced processing control. Another capability provided by the IC fabrication system 1100 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Based on the above discussions, it can be seen that the present disclosure implements a unique vertical GAA fabrication process flow. According to such a process flow, a plurality of semiconductor layers and a channel layer are formed with precisely controlled thicknesses. These semiconductor layers are then etched laterally to form recesses, and these recesses are subsequently filled by dielectric top and bottom spacers. A plurality of additional processes is then performed to form gate structures between each set of top and bottom spacers.

The unique fabrication process flow and the resulting IC device structure of the present disclosure offers advantages over conventional devices. It is understood, however, that no particular advantage is required, other embodiments may offer different advantages, and that not all advantages are necessarily disclosed herein. One advantage is the improvement in device uniformity. For example, by controlling the thicknesses of the semiconductor layers with enhanced precision, the subsequently formed top and bottom spacers can also achieve precise thicknesses. Furthermore, by controlling the thickness of the channel layer with enhanced precision, the subsequently formed gate structure can also achieve a precise gate length. Consequently, undesirable size variations between multiple devices may be reduced, and device performance and/or yield may be improved. Other advantages may include ease of fabrication and compatibility with existing fabrication processes.

The advanced lithography process, method, and materials described above can be used in many applications, including in IC devices using GAA transistors, as well as other three-dimensional devices, such as fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. To the extent that the present disclosure refers to a fin structure or FinFET devices, such discussions may apply equally to the GAA devices, and vice versa.

One aspect of the present disclosure pertains to a device. The device includes a channel component. The device includes a gate dielectric component located beside the channel component in a first cross-sectional side view. The first cross-sectional side view is defined by a vertical direction and a first horizontal direction. The device includes a gate electrode component. In the first cross-sectional side view, the gate dielectric component surrounds a top surface of the gate electrode component, a bottom surface of the gate electrode component, a first side surface of the gate electrode component, and a second side surface of the gate electrode component opposite the first side surface.

Another aspect of the present disclosure pertains to a device. The device includes a channel component. The device includes a first source/drain component disposed above the channel component in a first cross-sectional side view that is defined by a vertical direction and a first horizontal direction. The device includes a second source/drain component disposed below the channel component in the first cross-sectional side view. The device includes a gate structure disposed beside the channel component in the first cross-sectional side view. The gate structure includes a gate dielectric component and a metal-containing gate electrode component. The metal-containing gate electrode component is surrounded by the gate dielectric component in 360 degrees in the first cross-sectional side view.

Yet another aspect of the present disclosure pertains to a method. A vertically protruding structure is formed. The vertically protruding structure includes: a substrate, a first semiconductor layer disposed over the substrate, a channel layer disposed over the first semiconductor layer, and a second semiconductor layer disposed over the channel layer. The first semiconductor layer and the second semiconductor layer each contain a first type of semiconductive material. The channel layer contains a second type of semiconductive material different from the first type. First recesses are formed in the first semiconductor layer and the second semiconductor layer. Each of the first recesses protrudes laterally inward. The first recesses are filled with dielectric spacers. The channel layer and the substrate are laterally trimmed. The remaining portions of the channel layer and the dielectric spacers define second recesses that protrude laterally inward. Gate structures are formed in the second recesses.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
   a channel component;
   a gate dielectric component located beside the channel component in a first cross-sectional side view, wherein the first cross-sectional side view is defined by a vertical direction and a first horizontal direction;
   a gate electrode component, wherein in the first cross-sectional side view, the gate dielectric component surrounds a top surface of the gate electrode component, a bottom surface of gate electrode component, a first side surface of the gate electrode component, and a second side surface of the gate electrode component opposite the first side surface;
   a first spacer component disposed above the gate dielectric component in the vertical direction in the first cross-sectional side view; and
   a second spacer component disposed below the gate dielectric component in the vertical direction in the first cross-sectional side view;

wherein a side surface of the gate dielectric component protrudes beyond a side surface of the first spacer component or a side surface of the second spacer component in the first horizontal direction in the first cross-sectional side view.

2. The device of claim 1, wherein:
   the gate dielectric component surrounds the gate electrode component in 360 degrees in the first cross-sectional side view; and
   in a second cross-sectional side view defined by the vertical direction and a second horizontal direction perpendicular to the first horizontal direction, the gate electrode component is surrounded by the gate dielectric component in less than 360 degrees.

3. The device of claim 2, further comprising a gate contact, wherein in the second cross-sectional side view:
   the gate dielectric component is in direct contact with the top surface, the bottom surface, and the first side surface of the gate electrode component, but not in direct contact with the second side surface of the gate electrode component; and
   the gate contact is in direct contact with the second side surface of the gate electrode component.

4. The device of claim 1, further comprising an interfacial layer that is disposed between the channel component and the gate dielectric component in the first horizontal direction, wherein the interfacial layer includes a metal germanium oxide, a metal silicon oxide, or a metal germanium silicon oxide.

5. The device of claim 1, further comprising:
   a first source/drain component disposed above the channel component in the vertical direction in the first cross-sectional side view; and
   a second source/drain component disposed below the channel component in the vertical direction in the first cross-sectional side view.

6. The device of claim 5, further comprising:
   a third spacer component disposed above the first spacer component in the vertical direction in the first cross-sectional side view;
   a dummy material disposed below the second spacer component in the vertical direction in the first cross-sectional side view; and
   a dielectric component that is in direct contact with side surfaces of the first spacer component, the second spacer component, the third spacer component, the dummy material, and the gate dielectric component.

7. The device of claim 6, wherein:
   the first source/drain component includes a first portion and a second portion;
   the second portion is doped more heavily than the first portion;
   the first portion is in direct contact with a side surface of the first spacer component; and
   the second portion is in direct contact with a side surface of the third spacer component.

8. The device of claim 1, wherein:
   the device comprises a vertical gate-all-around (GAA) transistor;
   the channel component comprises a nano-structure channel of the vertical GAA transistor; and
   the channel component has a greater dimension in the vertical direction than the gate electrode component and the gate dielectric component combined.

9. A device, comprising:

a channel component;

a first source/drain component disposed above the channel component in a first cross-sectional side view that is defined by a vertical direction and a first horizontal direction;

a second source/drain component disposed below the channel component in the first cross-sectional side view;

a gate structure disposed beside the channel component in the first cross-sectional side view, wherein the gate structure includes a gate dielectric component and a metal-containing gate electrode component, and wherein the metal-containing gate electrode component is surrounded by the gate dielectric component in 360 degrees in the first cross-sectional side view;

a first spacer disposed above the gate structure in the first cross-sectional side view; and a second spacer disposed below the gate structure in the first cross-sectional side view;

wherein the gate structure laterally protrudes beyond the first spacer or the second spacer in the first horizontal direction.

10. The device of claim 9, wherein in a second cross-sectional side view defined by the vertical direction and a second horizontal direction perpendicular to the first horizontal direction, the metal-containing gate electrode component is surrounded by the gate dielectric component in less than 360 degrees.

11. The device of claim 9, wherein the gate structure further includes an interfacial layer disposed between the gate dielectric component and the channel component in the first cross-sectional side view, the interfacial layer containing a metal germanium oxide, a metal silicon oxide, or a metal germanium silicon oxide.

12. The device of claim 11, wherein a portion of a side surface of the channel component extends to at least one of the first spacer or the second spacer.

13. The device of claim 11, wherein a portion of a bottom surface of the first spacer extends to a top surface of the interfacial layer in the first cross-sectional side view.

14. The device of claim 9, wherein a dimension of the channel component is greater than a dimension of the gate structure in the vertical direction.

15. A device, comprising:

a channel layer;

a gate dielectric layer located laterally adjacent to the channel layer in a cross-sectional side view;

a gate electrode layer that is surrounded by the gate dielectric layer in the cross-sectional side view;

an interfacial layer disposed between the channel layer and the gate dielectric layer in the cross-sectional side view; and a source/drain disposed above or below the channel layer in the cross-sectional side view;

a first spacer disposed above the gate dielectric layer in the cross-sectional side view;

a second spacer disposed below the gate dielectric layer in the cross-sectional side view;

a third spacer disposed above the first spacer in the cross-sectional side view;

a dummy material disposed below the second spacer in the cross-sectional side view; and a dielectric component that extends to side surfaces of: the first spacer, the second spacer, the third spacer, the dummy material, and the gate dielectric layer.

16. The device of claim 15, further comprising a dielectric wherein at least one of the first spacer, the second spacer, or the third spacer is disposed laterally adjacent to the source/drain in the cross-sectional side view.

17. The device of claim 15, wherein:

the cross-sectional side view corresponds to a first vertical plane defined by a first horizontal direction and a vertical direction;

the gate electrode layer is surrounded by the gate dielectric layer in 360 degrees in the cross-sectional side view; and in a different cross-sectional side view that corresponds to a second vertical plane defined by a second horizontal direction and the vertical direction, the gate electrode layer is surrounded by the gate dielectric layer in less than 360 degrees.

18. The device of claim 17, further comprising a conductive contact, wherein:

the conductive contact extends to a side surface of the gate electrode layer in the different cross-sectional side view; and in the different cross-sectional side view: a portion of a side surface of the gate dielectric layer extends to a portion of a side surface of the conductive contact.

19. The device of claim 15, wherein in the cross-sectional side view:

a top surface of the channel layer has a more elevated vertical position than a top surface of the gate dielectric layer; and a bottom surface of the channel layer has a less elevated vertical position than a bottommost surface of the gate dielectric layer.

20. The device of claim 15, wherein a side surface of the gate dielectric layer is not aligned with the side surface of the first spacer or with the side surface of the second spacer.

* * * * *